(12) United States Patent
Hattori et al.

(10) Patent No.: US 6,927,002 B2
(45) Date of Patent: Aug. 9, 2005

(54) PHOTOMASK, THE MANUFACTURING METHOD, A PATTERNING METHOD, AND A SEMICONDUCTOR DEVICE MANUFACTURING METHOD

(75) Inventors: Takashi Hattori, Musashimurayama (JP); Yasuko Gotoh, Mobara (JP); Hidetoshi Satoh, Hitachinaka (JP); Toshihiko Tanaka, Tokyo (JP); Hiroshi Shiraishi, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 175 days.

(21) Appl. No.: 10/026,973

(22) Filed: Dec. 27, 2001

(65) Prior Publication Data

US 2002/0086223 A1 Jul. 4, 2002

(30) Foreign Application Priority Data

Dec. 28, 2000 (JP) ..................................... 2000-401154

(51) Int. Cl.⁷ ............................................... G03F 9/00
(52) U.S. Cl. ........................................................ 430/5
(58) Field of Search ......................... 430/5, 270.1, 296, 430/322

(56) References Cited

U.S. PATENT DOCUMENTS

| 6,007,969 | A | * | 12/1999 | Hatakeyama et al. | ....... 430/323 |
| 2002/0051928 | A1 | * | 5/2002 | Zampini | ..................... 430/138 |
| 2002/0182541 | A1 | * | 12/2002 | Gonsalves | .................. 430/287 |

FOREIGN PATENT DOCUMENTS

| JP | 56-030129 | 3/1981 |
| JP | 5-289307 | 11/1993 |
| JP | 2000-91192 | 3/2000 |

* cited by examiner

Primary Examiner—S. Rosasco
(74) Attorney, Agent, or Firm—Mattingly, Stanger & Malur, P.C.

(57) ABSTRACT

To develop a small quantity of various kinds of semiconductor devices in a short time and to realize a photomask suitable to be manufactured at a low cost. A shade pattern of a photomask is constituted by containing nanoparticles such as carbon in an organic film such as a photoresist film. A pattern is transferred to a photoresist on a semiconductor wafer by means of the reduction projection exposure using the photomask. At the time of the above exposure, it is possible to select exposure light within a range of wide wavelengths including i-line, KrF excimer laser beam, ArF excimer laser beam, or the like.

14 Claims, 9 Drawing Sheets

1

PHOTOMASK, THE MANUFACTURING METHOD, A PATTERNING METHOD, AND A SEMICONDUCTOR DEVICE MANUFACTURING METHOD

BACKGROUND OF THE INVENTION

The present invention relates to a photomask, a manufacturing method thereof, a patterning method, and a semiconductor device manufacturing method, and particularly a technique effectively applied to the photolithography using ultraviolet radiation, far ultraviolet radiation, vacuum ultraviolet radiation, or the like as a light source.

To manufacture a semiconductor integrated circuit device (LSI: Large Scale Integrated circuit), a lithography technique is used as a method for forming a micropattern on a semiconductor wafer. In the case of the lithography technique, the so-called optical projective exposure method is mainly used which repeatedly transfers a pattern formed on a photomask onto, a semiconductor wafer through a reduction projection optics. A basic configuration of an exposure system is disclosed in Japanese Patent Laid-Open No. 2000-91192.

A resolution R on a semiconductor wafer in the projective exposure method is generally shown by R=kxλ/NA, where k denotes a constant depending on a resist material or a process, λ denotes a wavelength of illumination light, NA denotes a numerical aperture of a projective exposure lens. As seen by the above relational equation, a projective exposure technique using a light source with a shorter wavelength is required as patterns are made more fine. At present, an LSI is manufactured by a projective exposure system using g-line (λ=438 nm) or i-line (λ=365 nm) of a mercury lamp, or a KrF excimer laser beam (λ=248 nm) as a light source. For the purpose of achieving a finer pattern, it is studied to use an ArF excimer laser beam (λ=193 nm) or $F_2$ excimer laser beam (λ=157 nm) having a shorter wavelength.

A normal photomask has a structure in which a thin film made of chromium or the like is formed as a shading film on a quartz glass transparent for exposure light. This photomask is manufactured by applying a resist onto a substrate in which a chromium film is attached to a quartz plate, exposing it in the form of a desired pattern prepared in advance, further developing it to form a resist pattern, and etching the chromium by using the resist pattern. In the case of this normal photomask, because steps of etching a chromium film and of peeling off the resist are required, it takes a lot of time to manufacture the photomask and the cost thereof increases.

Meanwhile, for example, Japanese Patent Laid-Open No. 5-289307 discloses a photomask using not chromium but a photoresist as a shading film. This is a mask using the fact that a photoresist has a shading characteristic relative to short wavelength rays such as ArF rays or the like. Because this technique makes it possible to fabricate a photomask without including a step of etching chromium, an effect of reducing the mask cost can be expected. Moreover, because there is no step of etching chromium, this technique has an advantage in that a pattern dimension accuracy can be ensured.

SUMMARY OF THE INVENTION

However, the present inventors have found the following problems in a photomask technique (hereafter referred to as a resist shade mask technique) using a photoresist as the above shading film.

That is, as shown in FIG. 9, a normal resist material has such a problem that it is impossible to obtain a sufficient shading characteristic against rays having a wavelength larger than 230 nm and therefore to completely function as a shading material. That is, the above resist shade mask technique has such a problem that it is impossible to be applied to KrF excimer laser exposure having a wavelength of 248 nm or i-line exposure having a wavelength of 365 nm. FIG. 9 shows OD values in the case of a resist using phenolic resin as a base resin, where the OD values mean values represented by $-\log_{10}(Iout/Iin)$ when it is assumed that incident light is Iin and transmitted light is Iout. Moreover, a transmittance T % is represented by 100×Iout/Iin, OD=−log(T/100). As an OD value increases, the transmittance of light decreases. A resist containing a normal benzene ring has a small OD value in the case of the light having a wavelength larger than 230 nm, similarly to FIG. 9. That is, a sufficient shading characteristic cannot be obtained from the resist because the resist has a high transmittance.

As a finer pattern is achieved, such problems have become more important because the working accuracy of a mask pattern becomes more stringent and the photomask manufacturing cost is increased due to increase of amounts of pattern data. In general, to manufacture one kind of semiconductor integrated circuit device, increase in the photomask manufacturing cost becomes a very large problem because about 20 to 40 photomasks are used, for example.

Under the above situation, however, it is necessary to make a circuit pattern more fine at present in order to improve a semiconductor device in integration degree and in operation speed, and thereby technical development is progressed so as to shorten the wavelength of exposure light. However, if the wavelength of exposure light is shortened, then a material of the lens is a rare and expensive material such as $CaF_{27}$ and illumination damage of an optical member increases, and thereby component life is shortened. Therefore, short-wavelength exposure light becomes expensive.

Moreover, because a KrF excimer laser beam or an i-line is normally used to manufacture a volume zone for a semiconductor device and the like, an adaptive wavelength in the above resist shade mask technique comes to an important problem. According to a study made by the present inventors, it has been found that when the above resist shade mask technique is used without a sufficient consideration, use of the ArF excimer laser exposure is required everywhere, and even if a photomask becomes inexpensive, the total manufacturing cost rather increases. Therefore, to reduce the cost, it is preferable to apply short wavelength exposure only to steps having such merits that performing fineness exceeds rise in cost and to apply the exposure at a comparatively low cost, to other steps.

Moreover, in the period of system LSIs, the requirement for developing and manufacturing small quantity of various types of LSIs in a short period has been raised. To manufacture LSIs as described above, 20 to 40 photomasks are used. Therefore, a photomask-manufacturing TAT (Turn Around Time) is the motive power of the competition power for developing LSIs. Particularly in the case of a system LSI, because the debugging rate of a wiring layer is high, supplying the photomask of this layer in a short time at a low cost is useful for short-term development of and cost reduction in LSIs.

Moreover, in the case of using a resist as a shade band similarly to the above resist shade mask technique, an ArF excimer laser beam having a comparatively high energy is absorbed by an organic resist material. The absorbed light energy excites organic molecules. Some of the light energy is emitted to the outside as fluorescence and phosphorescence and most of the light energy is emitted to the outside as heat energy. At this time, however, some of the energy may cut a chemical bond between organic molecules or cause reactions with other molecules. As a result, there arise such problems that a resist material serving a shade band deteriorates in accordance with illumination of an ArF excimer laser beam, and finally loses the function of a shade band.

An object of the present invention is to solve the above problems and to provide a technique capable of developing a small quantity of and various kinds of semiconductor devices in a short time and realizing a photomask most suitable to manufacture the devices at a low cost.

An object of the present invention is to provide a technique capable of realizing a photomask having a sufficient shading characteristic even against exposure light having a long wavelength.

An object of the present invention is to provide a technique capable of shortening time required for manufacturing a photomask.

An object of the present invention is to provide a technique capable of reducing the development period or manufacturing time of a semiconductor device.

An object of the present invention is to provide a technique capable of improving a light-resistant characteristic of a photomask.

An object of the present invention is to provide a technique capable of reducing the manufacturing cost of a photomask.

Further, an object of the present invention is to provide a technique capable of reducing the manufacturing cost of a semiconductor device.

The above and other objects and novel features of the present invention will become more apparent from the description of the present specification and the accompanying drawings.

Of the inventions disclosed in the present application, typical ones will be briefly described as follows.

That is, a photomask according to the present invention has, on a glass plate, a shade pattern containing at least nanoparticles and a binder.

It is proper to use quartz as a glass plate (mask substrate or mask plate) used for a photomask according to the present invention. However, other glass plate or crystal plate may be used if having a higher transmittance than the light used for transferring a pattern through the photomask. Materials of other glass plate or crystal plate include $CaF_2$ and $SiO_2$, for example.

Moreover, the above nanoparticles have each diameter of several $\mu$m order or less, and preferably of 1/10 the minimum working dimension, and, in this case, of 200 nm or less, and are ones that can scatter light, that is, means ones that can irregularly reflect light. Therefore, a flat metallic sheet made of chromium or the like having a smooth or rough face is not included. Moreover, nanoparticles each have, for example, light refractive index different from a binder. The photomask of the present invention functions as a photomask for preventing transmission of light because nanoparticles contained in the shade pattern scatter light. Fine particles of inorganic matter are used as nanoparticles contained in the shade pattern according to the present invention. Specifically, it is also possible to use fine particles of carbon such as carbon black, graphite or $C_{60}$, or fine particles of metal oxide such as titanium oxide, aluminum oxide, zinc oxide or the like, or fine particles of a metal such as aluminum, gold, silver, copper or the like. The above particle diameter of 200 nm is the maximum value. That is, diameters of nanoparticles contained in a pattern are distributed over the maximum value.

Moreover, the above binder is used to connect the above nanoparticles to each other to form a film, and a polymeric material or organic compound is generally used as the binder. When the photomask according to the present invention is formed, the shade pattern is formed by active radiation. Therefore, the binder utilized in the present invention is one that has any photosensitivity to radiation, namely, that is desirably made of a resist material.

Furthermore, the form of the photomask according to the present invention can be applied to all transmission types of photomasks such as a binary mask, half-tone phase-shift mask, Levenson phase-shift mask and the like which are used in a photolithography step. The photomask of the present invention can be used together with such a photomask structure as to use a metallic film such as a chromium film or the like as a shade band in one photomask. That is, it is also possible to use a structure having both a shade pattern formed by a metallic film and the above shade pattern of the present invention in the integrated-circuit-pattern area of one photomask. Thereby, only a predetermined portion on a photomask can be freely changed to a certain extent in a short time. That is, in the case of changing a portion of the photomask, only the portion to be changed can be changed, instead of reforming the entire photomask from the beginning. Therefore, it is possible to easily reproduce or change the photomask in a short time.

In this case where a Levenson phase-shift mask is used, it is preferable that the mask has such a structure as to be called a phase shifter in which a glass plate partially inverts the phase of exposure light (for example, changing the phase by almost 180°). The phase shifter is formed by any one of a denting method of making concavity in a portion of a glass plate that is a photomask plate and thinning film thickness of the portion to invert the phase of exposure light (for example, changing the phase by almost 180°), a method of forming a transparent film having such film thickness as to be capable of inverting a phase (for example, changing the phase by almost 180°) on the glass plate of a photomask, and a method obtained by mixing the above two methods. It is preferable that a shade pattern containing at least nanoparticles and a binder is formed on this phase shifter.

According to a technique studied by the present inventors, the technique is one that an organic material used as a resist material is formed on a glass plate of a photomask as a shade band, and that transmission of the light illuminated on the glass plate is prevented due to absorption of organic molecules at the shade band. This absorption is a specific absorption depending on the chemical structure of a material, and the wavelength of the absorption has a distribution to a certain extent, but is a specific wavelength. In this case, the light energy absorbed by the organic molecules excites the organic molecules. Then, some of the energy changes to heat or fluorescence or phosphorescence from an excited state and is discharged to the outside. However, remaining energy excites the organic molecules and cuts chemical bonds between the organic molecules or reacts with other chemical bonds. Therefore, as light is illuminated, the resist material serving as a shade band deteriorates, and finally loses the function as a shade.

In contrast, in the case of a photomask according to the present invention, nanoparticles contained in a shade pattern scatter the light energy illuminated on the photomask. Some of the light energy is absorbed. However, since scattering is a main function, a small amount of the energy is stored in a pattern portion and thereby deterioration is difficult to cause. Therefore, the life time of the photomask lengthens. Moreover, because the main function of nanoparticles is not absorption, the wavelength to be shaded is not restricted to a specific wavelength. That is, it is possible to obtain such a superior feature that a sufficient shading characteristic which cannot be obtained from the above resist shade mask can be obtained even when not only an ArF excimer layer beam (with wavelength of 193 nm) and an $F_2$ excimer laser beam (with wavelength of 157 nm) but also large-wavelength beams such as a g-line (with wavelength of 436 nm), an i-line (with wavelength of 365 nm), and a KrF excimer laser beam (with wavelength of 248 nm) are used as exposure light. That is, as seen from different operation described above, the present invention is a technique completely different from a photomask using a resist film as a shade band, in operation, configuration, and effects.

Moreover, by using, as the above nanoparticles, any one of inorganic matter, metal, and metal oxide that are more stable than organic matter in light energy and heat energy, there are such superior advantages that a chemical change is difficult to make relative to exposure light or the like, and that deterioration is difficult to make in the case of being used as the photomask. As the above inorganic matter, there is, for example, carbon, graphite, $C_{60}$ or the like. Moreover, as the above metal, there are, for example, gold (Au), silver (Ag), copper (Cu), aluminum (Al) or the like. Furthermore, as the above metal oxide, there are, for example, titanium oxide, aluminum oxide, zinc oxide or the like. Besides, pigment or dye may be used as the nanoparticles.

It is preferable to use fine particles of carbon such as graphite or $C_{60}$ as the above nanoparticles. A shade pattern containing fine particles of carbon such as graphite or $C_{60}$ can be removed through ashing. Therefore, there is such a superior advantage that a quartz or glass plate can be reproduced from a photomask having been once formed, by ashing.

Moreover, in the case of selecting the above metal or metal oxide as nanoparticles, simplicity of a process can be achieved. Moreover, there is such a superior advantage that it is possible to improve the dimension accuracy of the shade pattern.

Furthermore, in the case of using conductive inorganic matter, metal, or metal oxide as nanoparticles, it is possible to provide conductivity for a shade pattern. In this case, because the charge-up thereof can be reduced or prevented at the time of performing the electron-beam writing for patterning the shade pattern, it is possible to improve the pattern writing accuracy. Therefore, because the pattern dimension accuracy of a semiconductor device can be improved, it is possible to further improve the performance of the semiconductor device, and achieve development of the fineness and the integration degree of the device.

The shade pattern of the photomask according to the present invention may include dye molecules which absorb the light in addition to nanoparticles as components for transmitting no light. In this case, it is possible to reduce the quantity of nanoparticles to be contained, and thereby to obtain a high resolution. However, in the case where contribution of dye is large or only dye is simply contained as a material for shading light, light energy is absorbed by dye molecules and may cause both excitation of the molecules and any chemical reaction, and thereby absorbance may change. However, in the present invention, because the above nanoparticles are used together with others, such drawbacks can be difficult to cause or are not caused. That is, the present invention is greatly different, in configuration, from a photomask having a pattern with a shading characteristic obtained by merely making a resist film which contains light dye, and can improve the light-resistant characteristic better than the case of adding only the dye. Therefore, it is possible to improve the service life of the photomask.

It is preferable that the transmittance of the shade pattern portion of the present invention is 16% or less when a wavelength is 100 nm or more and 500 nm or less. In the case where a half-tone phase-shift mask is used as a photomask, it is preferable that the transmittance of the above shade pattern has a range of 2% to 16%, particularly preferable that the transmittance has a range from 4% to 9%. Moreover, in the case where a binary mask is used as a photomask, it is preferable that the transmittance of the above shade pattern portion is 1% or less, and more preferable that the transmittance is 0.5% or less, and particularly the most preferable that the transmittance is 0.1% or less. Furthermore, even in the case of a Levenson phase shift mask, it is preferable that the transmittance of the above shade pattern is 1% or less when a wavelength is 100 nm or more and 500 nm or less, and more preferable that the transmittance is 0.5% or less, and particularly the most preferable that the transmittance is 0.1% or less.

As previously described, to realize a low cost, it is preferable that a light source used for lithography has a longer wavelength. Therefore, it is preferable that the transmittance of the above shade pattern is 16% or less when a wavelength is 100 nm or more and 700 nm or less. Also in this case, if a half-tone phase shift mask is used as a photomask, then it is preferable that the transmittance of the shade pattern has a range from 2% to 16%, and particularly more preferable that the transmittance has a range from 4% to 9%. Moreover, in the case where a binary mask is used as a photomask, it is preferable that the transmittance of the shade pattern is 1% or less, and more preferable that the transmittance is 0.5% or less, and particularly the most preferable that the transmittance is 0.1% or less. Furthermore, even in the case of a Levenson phase-shift mask, it is preferable that the transmittance of the shade pattern is 1% or less when a wavelength is 100 nm or more and 700 nm or less, and more preferable that the transmittance is 0.5% or less, and particularly the most preferable that the transmittance is 0.1% or less. The above transmittances can be freely changed to a certain extent by changing the bending ratio between nanoparticles and a binder to be contained in the shade pattern. Moreover, they can be freely changed to a certain extent by changing the film thickness of the shade pattern. Furthermore, needless to say, they can be freely changed to a certain extent by changing both the blending ratio and the thickness.

In the case of shading light by using nanoparticles as previously described, shading the light is performed not by absorbing the light by a material thereof but mainly by scattering the light, and so the wavelength of the light to be shaded is not restricted to a specific wavelength. Therefore, at the time of forming a pattern through the exposure using a photomask of the present invention, it is possible to select a light source or an exposure system suitable for dimensions of a pattern to be transferred or for a manufacturing process thereof or the like, without restricting a usable light source or exposure system or the like which depends on a photomask. Therefore, it is possible to achieve improvement of both the pattern-dimension accuracy and reliability of a semiconductor device.

Moreover, there is the case of using visible light such as a helium-neon laser beam having a wavelength of 633 nm, for positional detection of a photomask. Even in such case, there is such an advantage that it is possible to easily detect the shade pattern having a transmittance of 16% or less when a wavelength is 100 nm or more and 700 nm or less.

Furthermore, each particle diameter of nanoparticles according to the present invention is made smaller than the minimum working dimension of the shade pattern, and preferably made to be 1/10 the minimum working dimension or smaller. Specifically, it is preferable to use a nanoparticle, for example, having a particle diameter of 200 nm or less, and more preferable to use a nanoparticle having a particle diameter of 100 nm or less. It is the most preferable to use a nanoparticle having a particle diameter of 50 nm or less. It is possible to use a nanoparticle having a particle diameter exceeding 200 nm. However, when each particle diameter is too large, a sufficient accuracy of the photomask is difficult to obtain because roughness of the sidewall of a pattern formed as the photomask increases. Moreover, when the particle diameter is too large, the nanoparticles contained in the shade pattern cannot scatter the light properly (uniformly). Each particle diameter of the nanoparticles contained in the shade pattern does not easily uniform, and so the nanoparticles having various particle diameters are contained. The particle diameter of 200 nm shown above is the maximum value and a distribution of particle diameters appears over the maximum value. Respective particle diameters of nanoparticles contained in the shade pattern may be equal or almost equal to each other. However, by containing both nanoparticles having relatively large particle diameters and those having relatively small particle diameters in the shade pattern, it is possible to distribute respective small nanoparticles between large nanoparticles. That is, it is possible to fill gaps between the large nanoparticles, with the small nanoparticles. Thereby, it is possible to change the transmittance of the above exposure light. Moreover, it is possible to reduce the transmittance of the exposure light in comparison with the case of constituting a shade pattern by only large nanoparticles. A particle diameter in this case means one measured as a nanoparticle or a group of nanoparticles at the time of measuring nanoparticles. Therefore, there are a case of the particle diameter of one nanoparticle and also a case of the diameter of an aggregate constituting a plurality of nanoparticles.

Furthermore, according to the present invention, it is preferable that the content of nanoparticles in a shade pattern containing at least nanoparticles and a binder is, for example, 10% or more and 99% or less out of the solid content of the shade pattern. To form the shade pattern, a binder occupies a certain amount because nanoparticles and a binder are normally combined with each other. However, by providing heat energy similarly to a sintering treatment after formation of a pattern, it is possible to reduce the binder part therein and increase the content of nanoparticles therein. Moreover, a shade pattern may be formed only by nanoparticles, with the binder part being almost zero or nothing.

Furthermore, it is possible to provide a protective film (a protective means) generally referred to as a pellicle, to the photomask of the present invention after formation of the photomask.

Furthermore, in the case where the photomask of the present invention is a Levenson phase-shift mask having a phase shifter, the phase shifter can be obtained by forming a coated-glass SOG (Spin On Glass) film at a predetermined position located on a glass plate so as to have a predetermined film thickness. Moreover, the phase shifter may be obtained by making concavity in a glass plate at a predetermined position up to a predetermined depth.

Furthermore, in both a photomask and a manufacturing method of the photomask according to the present invention, by simple steps of forming, exposing and developing a film containing at least nanoparticles and a binder, the photomask can be manufactured at a low cost in a short time. Moreover, because a sputtering step of using a vacuum system at the time of widely attaching a metallic film such as a chromium film or a step of etching the metallic film is not used, a yield for manufacturing the photomask is improved. Furthermore, by using nanoparticles made of the above carbon, carbon black, $C_{60}$ or the like, even after use of the photomask, the used photomask can be completely reproduced into a state of blanks through ashing or solvent treatment, and therefore this is effective in recycling of resources and reduction in the photomask cost.

Furthermore, a photomask manufacturing method of the present invention comprises the steps of: forming, on a glass plate, a film containing at least nanoparticles and a binder; exposing the film; and developing the film to form a shade pattern.

Furthermore, it is preferable to use quartz for a glass plate used in a photomask manufacturing method of the present invention. However, the glass plate is not restricted to quartz, and can make various modifications, and may be other glass pate or crystal plate as long as transmittance is very high relative to the light used to transfer a pattern through the above photomask. Furthermore, to enhance the adhesiveness between a glass plate and a resist material, a treatment step of accelerating the bonding between them such as a step of applying a hexa-methyl-disilazane (HMDS) treatment to them may be added.

Furthermore, a photomask manufacturing process of the present invention can be applied to all the transmission types of photomasks including a binary mask, a half-tone phase-shift mask, a Levenson phase-shift mask and the like which are used in a photolithography step. Among phase-shift masks, a Levenson phase-shift mask in which both a structure for partially inverting the phase of exposure light (e.g. inverting the phase by about 180°) and a shade band for preventing the exposure light from making transmission are formed on a transparent plate, can be formed by the following three kinds of methods.

First, in the case of forming a phase shifter by photo-reactive glass, the phase shifter is formed by the steps of: forming photo-reactive glass on a mask basic substance; exposing and developing the photo-reactive glass to form a phase shifter with a predetermined film thickness at a predetermined position thereof; forming, on the phase shifter, a film containing at least nanoparticles and a binder; and exposing and developing the film to form a shade pattern.

Moreover, in the case of forming a phase shifter by coated glass having no photosensitivity, the phase shifter is formed by the steps of: forming a coated-glass film on a mask basic substance; coating a resist onto the coated-glass film; exposing and developing the resist to form a resist pattern; etching the coated-glass film by using the resist pattern as a mask; removing the resist pattern to form a phase-shifter pattern, forming, on the phase-shifter pattern, a film containing at least nanoparticles and a binder; and exposing and developing the film to form a shade pattern.

Furthermore, in the case of making concavity in a transparent glass plate itself to form a phase shifter, the phase shifter is formed by the steps of: coating a resist onto a mask basic substance; exposing and developing a desired shifter pattern on the resist to form a resist pattern; treating the mask basic substance by using the resist pattern as a mask; removing the resist pattern to form a phase-shifter pattern; forming, on the phase-shifter pattern, a film containing at least nanoparticles and a binder; and exposing and developing the film to form a shade pattern.

In the case where a photomask to be formed is a normal binary mask or a half-tone phase-shift mask, the step of treating the above phase shifter is not required.

Moreover, in a photomask of the present invention, it is possible to use a chromium film or the like as a shade band, with a shade pattern containing at least nanoparticles and a binder. In this case, after a shade band made of chromium or the like, except for a predetermined portion of a photomask by a generally known method. A shade pattern containing at least nanoparticles and a binder may be formed only on the predetermined portion by the above method. In the case of the above photomask structure, a shade pattern formed by a metallic film and the above shade pattern containing nanoparticles are arranged on one photomask.

Furthermore, a material for forming a shade pattern used for a photomask manufacturing method of the present invention is characterized by containing at least nanoparticles and a binder. In this case, the binder is used to form a film by connecting the nanoparticles to each other, and polymer or organic compounds are generally used as the binder. In the case of manufacturing of the photomask of the present invention, a shade pattern is formed by actinic irradiation. Therefore, it is preferable that the binder used for the present invention is made of a material having photo-sensitivity to the radiation, which is a resist material. Therefore, a material, in which nanoparticles are dispersed in a resist material using polymer or organic materials, may be used. In this case, the term "dispersed" means such a state that fine particles float in a resist solution. To prevent fine particles from settling, floating or becoming un-uniform in a dispersed state, it is preferable to add a dispersant for helping dispersion as occasion demands. The resist material has a positive type one in which an exposed portion is removed through development, and a negative type one in which an unexposed portion is removed through development. Either of them may be used as occasion demands. Because the nanoparticles used in this case are also the same as those above described, the description thereof will be omitted.

Also in the case of a photomask manufacturing method of the present invention, the transmittance of the above exposure light is the same as one previously described. Therefore, the description thereof will be omitted. Moreover, because particle diameters of the nanoparticles are the same as those previously described, the description thereof will be omitted.

Furthermore, any light source or beam source, which is used for a step of exposing a film containing at least nanoparticles and a binder used for a manufacturing method of the photomask according to the present invention, may be used as long as it emits active radiation. However, in the present invention, a resist film contains at least nanoparticles, and thereby there are some cases where the exposed light may not reach the bottom of the film. Therefore, in the case of using the light for manufacturing the photomask, it is necessary to select a proper wavelength.

From the above reasons, it is preferable to use one of an electron-beam writing system and an ion-beam exposure system and the like, as a system for emitting active radiation used for exposure. In the case of the exposure by the electron-beam writing system or ion-beam exposure system, the exposure is different from exposure by light and an exposure beam reaches the lower portion of a film. Therefore, a pattern can be easily formed. Moreover, these systems each have such an advantage that it is possible to generate an active radiation having a desired shape without passing through a photomask and to selectively apply the active radiation to a predetermined portion.

In the case of writing a pattern by an electron beam of the above electron-beam writing system, it is preferable to form a discharge layer for preventing charge-up thereof on a film containing at least nanoparticles and a binder. Moreover, in the case where a step of forming a phase shifter is included in a photomask manufacturing method, it is preferable to form a discharge layer on a resist for treating the phase shifter.

Moreover, in a photomask manufacturing method of the present invention, a plate provided with a film containing at least nanoparticles and a binder may be heat-treated before development and after exposure. In the case of using a chemical amplified resist film as a binder, it is possible to accelerate a reaction by performing the above heat treatment. Therefore, it is possible to easily form a pattern and to sufficiently exhibit a function as a resist.

Furthermore, in a photomask manufacturing method according to the present invention, any developer may be used as long as the developer can develop a film containing at least nanoparticles and a binder. It is better to use an aqueous alkali solution than an organic solvent as a developer. As the aqueous alkali solution, it is possible to use an aqueous nonmetallic-alkali solution such as tetramethylammonium hydroxide or an aqueous alkali-metal-containing alkali solution such as sodium hydroxide, or potassium hydroxide. Moreover, water may be used as a developer if the water can have a development function.

Furthermore, it is preferable that the above aqueous alkali solution contains a surface active agent in order to improve the development characteristic. As the surface-active agent, there is alkylsulfate sodium salt, polyoxyalkylene, tetraalkylammonium halide or the like. By adding these surface-active agents to an alkaline developer, it is possible to prevent a residue remaining at the time of development. When development is performed by the above developer, a spray development may be used, or an immersion-type development may be performed. Moreover, ultrasonic waves may be utilized during development in order to prevent a residue remaining at the time of development. It is possible to improve a cleaning effect by the above ultrasonic-wave treatment. Particularly, in the case of the present invention, because the present invention contains the above nanoparticles, the ultrasonic-wave treatment is effective in removal of the nanoparticles.

Furthermore, in a photomask manufacturing method of the present invention, it is possible to improve the light-resistant characteristic of a photomask by giving energy to a shade pattern formed after a step of developing a film containing at least nanoparticles and a binder. Though the above shade pattern contains at least nanoparticles and a binder, it is also possible to reduce the content of a binder portion by giving heat energy like a sintering treatment after formation of a shade pattern. Moreover, it is possible to make the content of the binder portion almost zero (such a state that the nanoparticles contained in the pattern is relatively more than the binder in content.) or nothing. It is also effective to heat treating a shade pattern while the pattern is illuminated with ultraviolet radiation (DUV rays), in order to prevent the pattern from being deformed. At this time, preferably, it is possible to raise the heat-treatment temperature, for example, up to about 250° C., and it is possible to further improve the light-resistant characteristic.

Furthermore, in the case of a photomask manufacturing method of the present invention, it is possible to provide a protective film generally called a pellicle after formation of the mask.

Furthermore, a pattern forming method of the present invention comprises the steps of: forming, on a substrate to be treated, a film formed of a photo-reactive composition; exposing a photo-reactive composition film through a photomask on which a predetermined pattern is formed; and developing the photo-reactive composition film to form a pattern of the photo-reactive composition on the substrate to be treated, wherein the photomask is constituted so as to have, on a glass plate, a shade pattern containing at least nanoparticles and a binder.

Because a glass plate of a photomask used in a pattern forming method of the present invention is the same as one mentioned above, the description thereof will be omitted.

A photomask used in a pattern forming method of the present invention functions as a photomask similarly to one described above because nanoparticles contained in a shade pattern disperse light. A pattern forming method of the present invention can be applied to all the transmission types of photomasks including the above binary mask, half-tone phase-shift mask, Levenson phase-shift mask and the like. Moreover, as described above, the method can be applied to such a photomask as to have both a shade pattern formed by a metal and a shade pattern formed by a film containing the above nanoparticles. Because the configuration of the Levenson phase-shift mask is the same as one mentioned above, the description thereof will be omitted.

Because operations and effects of the photomask used in the pattern forming method are also the same as one mentioned above, their description will be omitted. Moreover, because material (including modifications) and particle diameters of the nanoparticles, and transmittance relative to exposure wavelength of the nanoparticles, and detective position of a photomask, and the configuration in which both the content of nanoparticles and the binder are reduced, are also the same as one mentioned above, their description will be omitted.

In the case of a pattern forming method of the present invention, it is preferable that wavelength of the light used to expose a photo-reactive composition film on a wafer is 100 nm or more and 700 nm less. In the case of using a larger exposure-light wavelength, for example, it is possible to use a high-pressure mercury-vapor lamp as a light source, and so realize a low cost because a light source or an exposure system is comparatively inexpensive. However, because a resolution relates to a wavelength, the resolution is not improved if an exposure wavelength is a large wavelength. In contrast, in an exposure system using, as a exposure light, a small wavelength such as an ArF or KrF excimer laser beams or the like, the price thereof is high in the existing circumstances but the resolution is further improved for reduction in the wavelength and a fine pattern can be formed.

Moreover, in the case of a pattern forming method of the present invention, similarly to one mentioned above, a photo-reactive composition film may be heat-treated before development and after exposure. As described above, when the photo-reactive-composition film is made of a resist using an acid catalyst called a chemical amplified resist, the above heat treatment is required to progress a chemical reaction.

Furthermore, in the case of a pattern forming method of the present invention, it is preferable that a developer is a water alkaline developer because the developer does not greatly influence the natural environment.

Furthermore, a semiconductor device manufacturing method of the present invention includes the steps of: forming a resist pattern on a semiconductor substrate by any one of the above pattern forming methods; and etching the semiconductor substrate in accordance with the resist pattern or implanting ions into the semiconductor substrate.

As an etching method used in a semiconductor device manufacturing method of the present invention, any one of dry etching methods such as a plasma etching, a reactive-ion etching, a reactive-ion-beam etching methods or the like, and a wet etching may be used.

Moreover, as a substrate to be treated by a semiconductor device manufacturing method according to the present invention, any one of a silicon-dioxide film formed by a CVD (Chemical Vapor Deposition) method or a hot oxidation method, and an oxide film such as an applied glass film, and a nitride film such as a silicon nitride film may be used. Moreover, any one of various types of metallic films made of aluminum, an aluminum alloy, and tungsten or the like, and a film made of polysilicon, and the like may be used.

Furthermore, in the case of a semiconductor-device manufacturing method of the present invention, it is possible to form a photomask used in the method, at a low cost in a short time. As a result, it is possible to manufacture a semiconductor device at a lower cost in a quick TAT (Turn-Around-Time).

DETAILED DESCRIPTION OF THE PREFERRED EMBODIMENTS

Figure 1:
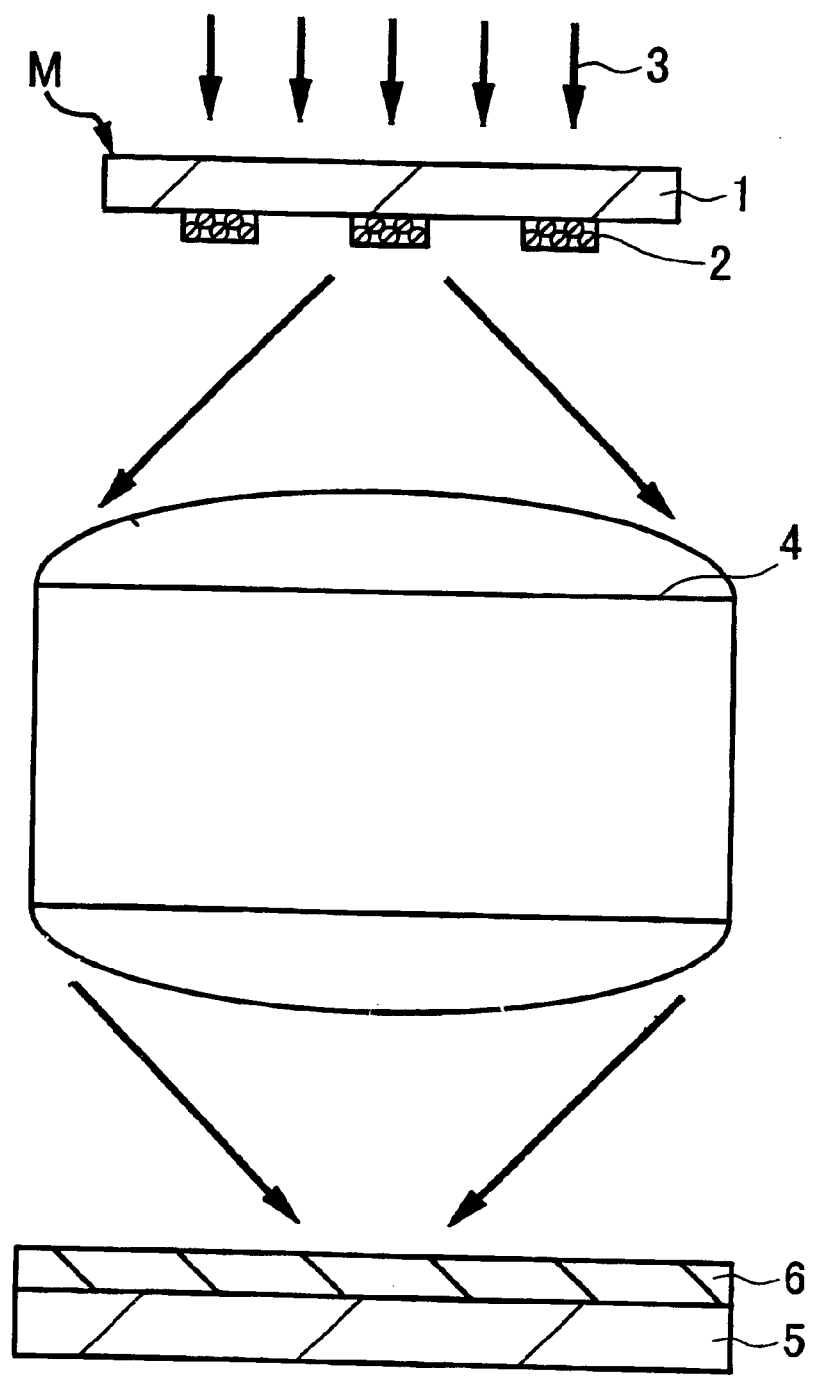
FIG. 1 is an explanatory view of an exposure method in a manufacturing process of a semiconductor device that is an embodiment of the present invention.

The following embodiments will be described by dividing advantageously a plurality of sections or a plurality of sub-embodiments noting that, except where especially described, the subdivisions have something to do with each other. Further, one among the plurality of sections or sub-embodiments has something to do with a part or all of the others, or all of the modifications thereof, or detailed or supplementary explanations, or the like.

Moreover, in the case of the following embodiments, when the number of factors (including the number of pieces, value, quantity, range, and the like) is described, the number of factors is not restricted to the specified number and is allowed that the number of factors may be the specified number or more or less, except where particularly specified or where the number of factors is theoretically clearly restricted to the specific number and the like.

Moreover, in the case of the following embodiments, it is needless to say that components (including elementary steps and the like) thereof are not always essential, except where particularly specified or where the components are thought to be theoretically and clearly essential, and the like.

Similarly, in the case of the following embodiments, when shapes or positional relations of components are described, shapes substantially approximating to or similar to respective original shapes are included except where particularly specified, or where the shapes are not thought to be theoretically and clearly approximating to or similar to the original shapes. These are also the same as the above-mentioned values and ranges.

Furthermore, through all the drawings for explaining the present embodiments, components having the same function are denoted by the same reference symbol and repetitive description will be omitted.

Furthermore, in the case of the present embodiments, an MIS.FET (Metal Insulator Semiconductor Field Effect Transistor) which is an example of a field effect transistor will be abbreviated as an MIS, a p-channel MIS.FET will be abbreviated as a pMIS, and an n-channel MIS.FET will be abbreviated as an nMIS.

Furthermore, in the case of the drawings used in the present embodiments, a shade band (a shading film, a shading pattern, a shading area, or the like) and a resist film will be hatched even for a plan view in order to easily see the drawings.

The embodiments will be described below in detail by referring to the accompanying drawings. Before describing the embodiments, preparation of a resist material containing at least nanoparticles and a binder will be described below.

PREPARATION EXAMPLE 1

A resist (I) is prepared in which carbon having a solid content of 16% is dispersed by adding propyleneglycolmethylether acetate (PGMEA) to 10 g of polyhydroxystyrene (weight-average molecular weight of about 20,000), 4 g of 2,6-bis (4-azidebensal) acetone-2,2'-disulfonic acid-N,N-diethyleneoxyethylamide, 75 g of carbon black dispersion (carbon-black particle-diameter of about 20 nm and percentage content of 20 wt %) obtained by using a solvent as propyleneglycolmethylether acetate (PGMEA), and 1.5 g of hexamethoxymethylmelamine.

PREPARATION EXAMPLE 2

A resist (II) is prepared in which carbon having a solid content concentration of 14% is dispersed by adding PGMEA used as a solvent, to 12 g of poly(p-hydroxystyrene-co-t-butylacrylate (molar ratio=52/48), 0.6 g of naphtylimide triflate, and 50 g of carbon black dispersion (carbon-black particle diameter of about 20 nm and content of 17 wt %) obtained by using a solvent as propyleneglycolmethylether acetate (PGMEA).

PREPARATION EXAMPLE 3

A resist (III) is prepared in which titanium dioxide having a solid-content concentration of 16% is dispersed by adding PGMEA used as a solvent, to 10 g of m, p-cresol novolac resin (weight-average molecular weight of 7,800), 3.0 g of hexamethoxymethylmelamine, 0.5 g of 2,4-bis(trichloromethyl)-6-phenyl-1,3,5-triazine, and 50 g of titanium dioxide dispersion (titanium-dioxide particle diameter of about 20 nm and content of 20 wt %) obtained by using a solvent as propyleneglycolmethylether acetate (PGMEA).

PREPARATION EXAMPLE 4

A resist (IV) is prepared in which aluminum oxide having a solid-content concentration of 16% is dispersed by adding isoamyl acetate used as a solvent, to 10 g of m, p-cresol novolac resin (weight-average molecular weight of 4,800), 1.4 g of poly (methylpentene-sulfone)(weight-average molecular weight of 43,500), and 50 g of aluminum-oxide ($Al_2O_3$) dispersion (aluminum-oxide particle diameter of about 30 nm and content of 20 wt %) obtained by using a solvent as isoamyl acetate.

PREPARATION EXAMPLE 5

A resist (V) is prepared in which carbon having a solid content of 16% is dispersed by adding PGMEA used as a solvent, to 6.0 g of poly(methylmethacrylate-co-acrylic acid-co-hdroxyethylacrylate)(molar ratio of 70:20:10), 4.0 g of pentaerythritol triacrylate, 0.2 g of t-butylanthraquinone, 0.01 g of ethylviolet, 0.10 g of p-methoxyphenol, 0.1 g of 2,2,6,6-tetramethy-1-piperiodinyloxy, and 30 g of carbon-black dispersion (carbon-black particle diameter of about 20 nm and content of 20 wt %) obtained by using a solvent as propyleneglycolmethylether acetate (PGMEA).

First Embodiment

In a first embodiment of the present invention, as shown in FIG. 1, a photoresist (hereafter referred to as a resist) 6 applied onto a principal plane (device forming plane) of a semiconductor wafer (hereafter referred to as a wafer) 5 has been exposed through a projection lens 4 by illuminating a shade pattern 2 formed on the quartz plate (a glass plate, a mask basic substance, or a mask plate) 1 of a photomask (hereafter referred to as a mask) M with exposure light 3. The shade pattern 2 contains at least the above nanoparticles and the binder.

A step-and-repeat exposure method or a scanning exposure method may be used as the exposure method utilized at this exposure. The step-and-repeat exposure method is an exposure method for transferring a circuit pattern on a mask, to a desired portion on a wafer, by repeatedly stepping a wafer on a projection image of the circuit pattern provided on the mask. A system for performing the exposure method is referred to as a stepper. Moreover, the scanning exposure method is an exposure method for transferring a circuit pattern on a mask, to a desired portion on a wafer, by relatively and continuously moving (scanning) a thin slit-like exposure belt in a direction vertical to a longitudinal direction of a slit relative to the wafer and the mask (or the belt may be slantly moved). A system for performing this exposure method is referred to as a scanner. The step-and-scan exposure is a method of exposing the whole of a portion to be exposed on the wafer, by combining the above scanning exposure with the above-mentioned stepping exposure, which corresponds to the subordinate concept of the above scanning exposure.

Moreover, conventional illumination or oblique illumination may be used as illumination utilized at the exposure. The conventional illumination means normal illumination whose light-intensity distribution is comparatively uniform. Moreover, the oblique illumination is illumination whose central illuminance is lowered and includes multi-pole illumination such as off-axis illumination, annular illumination, quadra-pole illumination, penta-pole illumination or the like, or a resolution enhancement technique using a pupil filter equivalent to the multi-pole illumination.

Figure 2A:
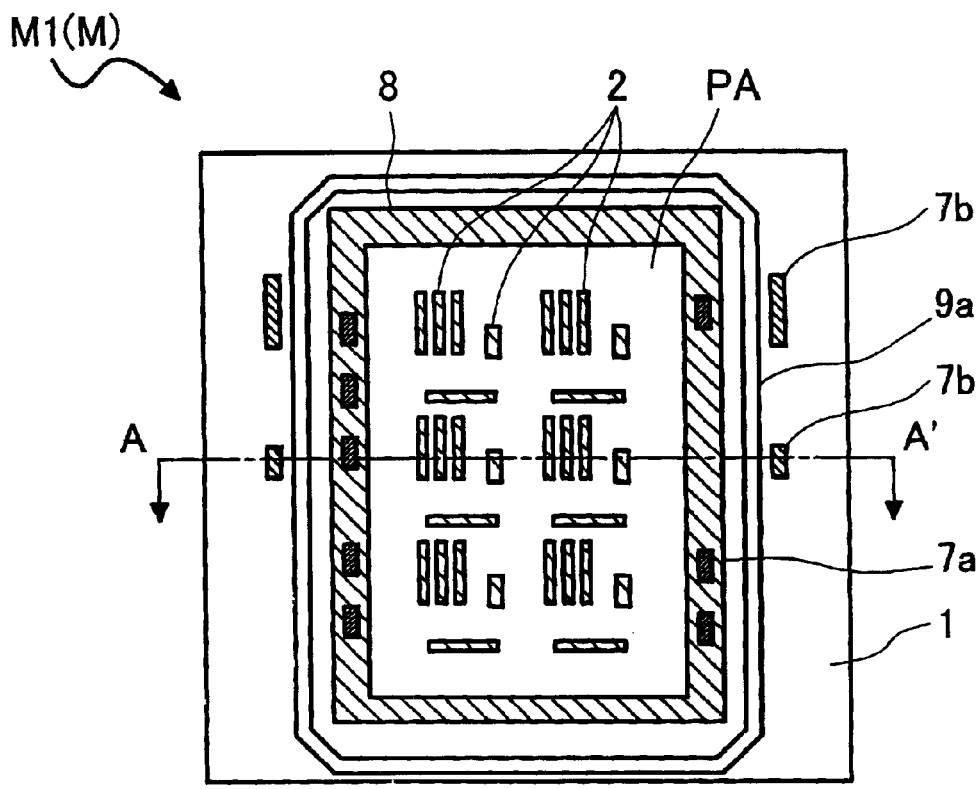
FIG. 2A shows a photomask used by an exposure method described in FIG. 1, and is a general plan view of the photomask.
Figure 2B:
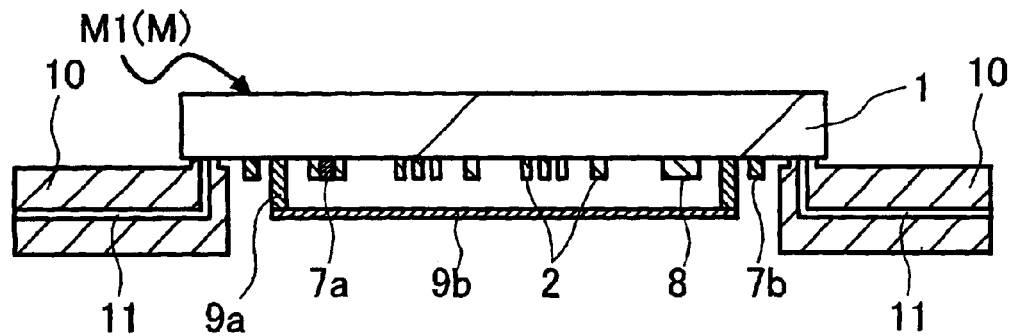
FIG. 2B shows a photomask used by an exposure method described in FIG. 1, and is a cross-sectional view of the photomask taken along line A-A' in FIG. 2A.

Details of an example of the mask M having been used for the above case will be described below by referring to FIGS. 2A and 2B. FIGS. 2A and 2B show a plan view and a cross-sectional view of a mask M1 (M) manufactured by the present method, respectively. FIG. 2A is a plan view and FIG. 2B is a cross-sectional view taken along line A-A' when the mask M1 is mounted on an exposure system. Reference symbol 7a denotes a wafer alignment mark used to perform alignment between layers. Reference symbol 7b denotes a reticle alignment mark for obtaining an accurate position of the mask M1. Reference symbol PA denotes a pattern area. Reference symbol 8 denotes a shade band which is an area corresponding to a scribe line of an IC (Integrated Circuit) or the like. Reference symbol 9a denotes a pellicle frame. Reference symbol 9b denotes a pellicle film for protecting the mask M1 from foreign matter or the like and preventing foreign matter from being easily transferred. Reference symbol 10 denotes a reticle stage of the exposure system. Reference symbol 11 denotes a contact point between the reticle stage 10 and the mask In this case, the above shade pattern 2 has not been formed at a portion of the mask M1 with which the pellicle frame 9a, the reticle stage 10, and a reticle carrying system (not illustrated) are in contact. This is because if the shade pattern 2 is formed on the contact point, the shade pattern 2 is removed therefrom at the time of contact and becomes subject to foreign matter defect. This is also the reason for avoiding such a problem that the pellicle frame 9a is removed therefrom.

Exposure light is emitted from the upper side of FIG. 2B under exposure and the shade pattern 2 is transferred onto a wafer through a projection lens disposed in a lower face side thereof. At the portion where the shade pattern 2 is formed, light is dispersed and shaded by nanoparticles in the shade pattern 2 instead of a metallic film such as chromium or the like. In the case of the mask M1 (M) of the present invention, nanoparticles contained in the shade pattern 2 scatter optical energy illuminated into the mask M1 (M). Though some of the optical energy is absorbed, an amount of the optical energy stored in the shade pattern 2 is small because scattering is a main operation and therefore deterioration thereof is difficult to generate. That is, the mask M1 (M) of this embodiment makes it possible to improve the light-resistant characteristic (durability).

In this case, though the shade band 8 and reticle alignment mark 7b are constituted by the above shade pattern 2, they may be constituted, for example, by a single film made of chromium (Cr) or a laminated film formed by depositing chromium oxide (CrO$_x$) on chromium. Particularly, it is preferable that the reticle alignment mark 7b formed outside of the pellicle frame 9a is constituted by a metal for the purpose of protecting the mark 7b from exposure-system pollution. This is because since the pellicle functions as a protective film in the pellicle frame 9a illumination of the exposure light can prevent a lens of the exposure system from being polluted by gas generated from the above-mentioned shade pattern 2, but the gas generated from the above shade pattern 2 pollutes the lens of the exposure system at the outside of the pellicle frame 9a.

Figure 3A:
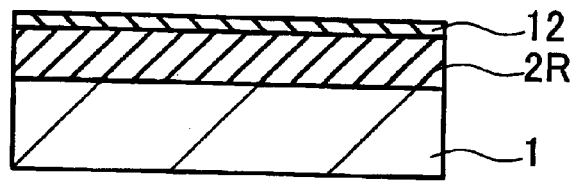
FIG. 3A is a cross-sectional views of an essential portion in the manufacturing process of a photomask used in the exposure method described in FIGS. 1, 2A and 2B.
Figure 3B:
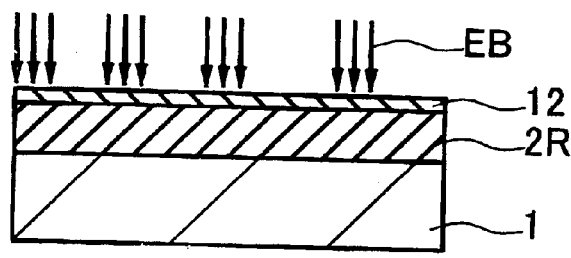
FIG. 3B is a cross-sectional views of an essential portion in the manufacturing process of a photomask used in the exposure method described in FIGS. 1, 2A and 2B.
Figure 3C:
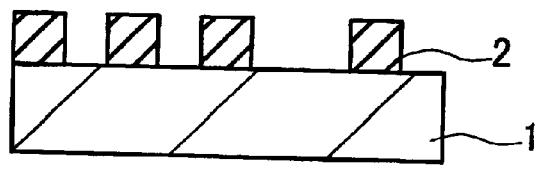
FIG. 3C is a cross-sectional views of an essential portion in the manufacturing process of a photomask used in the exposure method described in FIGS. 1, 2A and 2B.

Then, an example of a photomask manufacturing method that is the present invention will be described below by referring to FIGS. 3A to 3C showing a photomask manufacturing process. FIGS. 3A to 3C are cross-sectional views of essential portions of the integrated-circuit pattern in a mask-M manufacturing process described in FIGS. 1, 2A and 2B.

First, as shown in FIG. 3A, a resist film 2R made of the above-mentioned resist (I), in which carbon prepared as described for the preparation example 1 is dispersed, is spin-coated on the quartz plate (blanks) 1 as a resist material for forming a shade pattern containing at least nanoparticles and a binder, and is baked, for example, for about 2 minutes at 100° C. to obtain a film having a thickness of about 520 nm. Thereafter, a water-soluble conductive layer 12 is applied onto the resist film 2R to write a desired pattern on the resist film 2R, for example, by an electron beam EB obtained by using an electron-beam writing system (HITACHI L-800D) having an acceleration voltage of 50 KV as shown in FIG. 3B. By having applied the water-soluble conductive layer 12, it is possible to prevent charge-up thereof at the time of illumination of an electron-beam EB and improve the transfer accuracy of patterns. Moreover, by providing conductivity for the resist film 2R itself, it is possible to prevent charge-up thereof. In this case, because it is unnecessary to apply the water-soluble conductive layer 12 thereon, simplification of the process and reduction in material and fuel costs and the like can be achieved.

Figure 4:
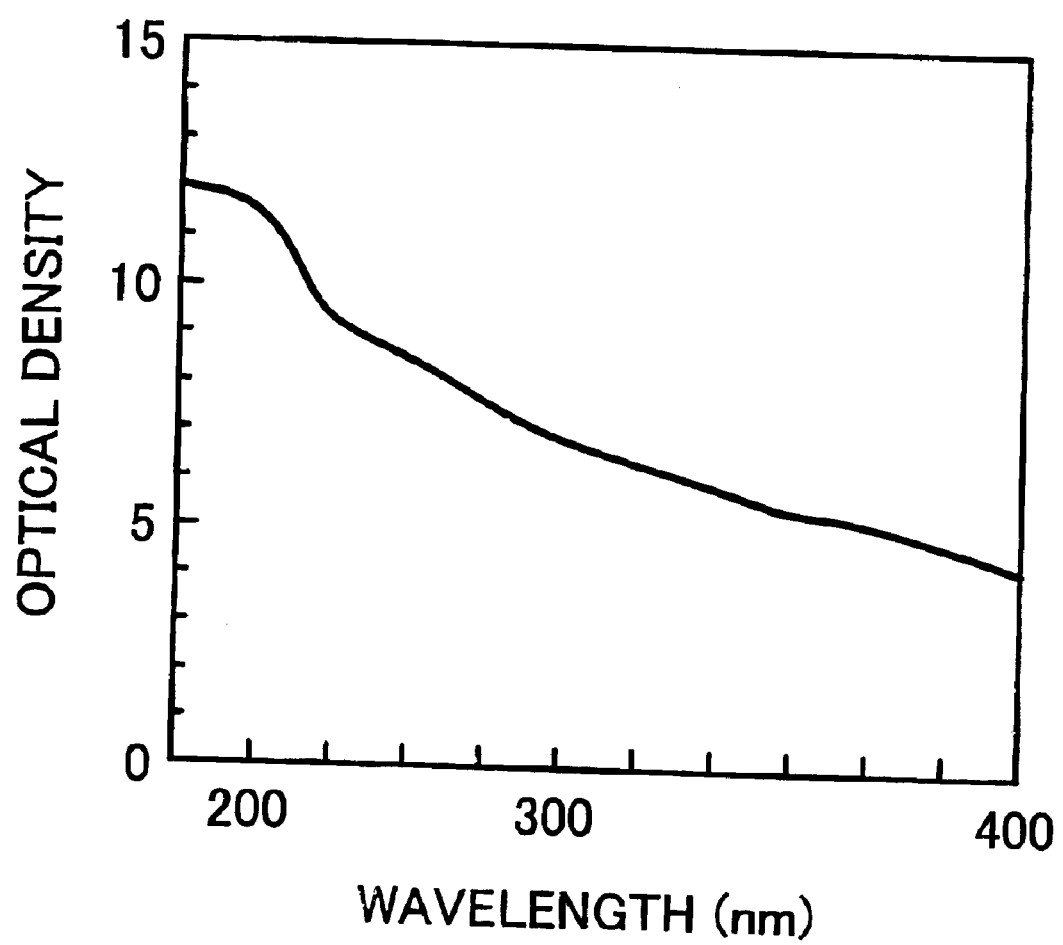
FIG. 4 is a characteristic diagram showing a spectral characteristic of a resist (I) in which carbon is dispersed, the carbon constituting a pattern of the mask used in the exposure method that is an embodiment.

In the case of the resist (I) used above in which carbon is dispersed, light is scattered by carbon particles dispersed in a resist film and thereby transmission of the light is prevented. FIG. 4 shows OD (Optical Densitomer) values separately measured by a spectrophotometer where the film thickness of the resist (I) dispersing carbon is equal to, for example, 1.0 μm. In this case, an OD value denotes a value represented by $-\log_{10}$(Iout/Iin) when it is assumed that incident light is Iin and transmitted light is Iout. Moreover, because a transmittance (T %) is shown as 100×Iout/Iin, an OD value is represented by $-\log$(T/100). In the case of the resist (I) of the present invention in which carbon is dispersed, transmission of light is suppressed because dispersed carbon fine particles work as scatter members. Upon a film thickness of 1.0 μm, the OD value is, for example, 11.6 at an ArF-excimer-laser-beam (wavelength of 193 nm), and 8.0 at a KrF-excimer-laser-beam (wavelength of 248 nm), and 5.0 at an i-line exposure-light (wavelength of 365 nm).

After electron-beam writing, as shown in FIG. 3C, development is performed, for example, by aqueous of 2.38 wt % tetramethylammonium hydroxide (TMAH) containing 0.3 wt % dodecylsulfate sodium as a surface active agent, and thereby the shade pattern 2 containing at least carbon is formed. A discharge film used in this case is water-soluble, which is removed simultaneously with resist-pattern development. The resist (I) dispersing carbon is a negative resist, for example, by which a desired pattern having the minimum dimension of 0.8 μm at a remaining film thickness of 500 nm is formed at an exposure rate of 20 μC/cm$^2$. Thereby, it is possible to form the mask M1 (M) having a desired-shaped shade pattern 2 containing fine particles of carbon black.

In the case of this embodiment, it is possible to eliminate a step of etching a metallic film made of chromium or the like because the shade pattern 2 can be formed through development. Therefore, it is possible to greatly decrease time required for the manufacturing the mask M. Moreover, because a dimensional error can be eliminated which occurs in the case of etching a metallic film made of chromium or the like, it is possible to improve the dimensional accuracy of the shade pattern 2. Moreover, a step of etching a metallic film made of chromium or the like can be eliminated, and the material cost, fuel cost, equipment cost and the like thereof can be reduced. Thereby, it is possible to greatly reduce the cost of a mask.

As a result of measuring the OD value of the shade pattern 2 formed through electron-beam writing, the OD value converted into a film thickness of 1.0 μm is almost equal to that shown in FIG. 4. Therefore, because the OD value corresponding to 500 nm is 4.0 at a KrF-excimer-laser-beam (wavelength of 248 nm), and is 0.01% in terms of transmittance, it is clarified that the mask M1 (M) is proper as a mask for KrF-excimer-laser exposure. Moreover, when the mask M1 is applied as an i-line mask, the OD value corresponding to 500 nm is 2.5, and is a slightly large value of 0.32% in terms of transmittance. Though even this film thickness can be used for i-line, another mask having a film thickness of 600 nm is formed by slightly increasing the film thickness of the resist (I) in which carbon is dispersed. The OD value corresponding to 365 nm is 3.0 when film thickness is 600 nm, and is 0.10% in terms of transmittance. Moreover, the transmittance of the resist (I) in which carbon is dispersed is smaller when an ArF excimer-laser beam has a wavelength of 193 nm. Therefore, a mask is formed by setting a value of a film thickness at 300 nm. The OD value at this time is 3.5 and the transmittance thereof is 0.32%.

Moreover, as a result of forming a mask for KrF excimer-laser-beam exposure with the shading portion having a different transmittance, the mask functions as a mask at a transmittance of 1% or less. Moreover, it is clarified that a mask having a transmittance of 0.5% or less is more preferable because the linearity of an isolated pattern is ensured. Furthermore, it is clarified that a mask having a transmittance of 0.1% or less is still more preferable because the linearity of crowed patterns is ensured.

After the masks are developed, they are heat-treated in order to further improve the resistances relative to exposure light when they are used as masks. Though the heat-treatment temperature is set, for example, at 120° C., this temperature depends on a resist material. It is preferable to perform the heat treatment at a higher temperature as long as a resist pattern is not deformed. A film thickness or transmittance is not almost changed through the above heat treatment.

The mask of this embodiment can be manufactured by applying, exposing, and developing an organic film and the mask manufacturing yield is also high because there is no sputtering step using a vacuum system when a metallic film made of chromium (Cr) or the like is attached widely and no step of etching the metallic film is included. Moreover, in the case of using carbon black as nanoparticles similarly to this embodiment after use of a mask, it is possible to completely reproduce the carbon black in a state of blanks by ashing or solvent treatment. Therefore, the above mentioned embodiment is effective from viewpoints of resource recycling and cost reduction.

Then, a pattern forming method using this mask will be described below.

First, a hexamethyldisilazane (HMDS) treatment is performed relative to the principal plane (device forming plate) of a semiconductor substrate (semiconductor wafer) made of silicon (Si) or the like, and then a hand-made Deep-UV resist [a resist made of 10 g of 1-ethoxyethyl protected polyvinylphenol (1-ethoxyethyl ratio of 48%), 0.10 g of 1,2,3-tris (ethansulfonyloxy)benzene, 0.0020 g of benzylamine, and 40 g of cyclohexanone] is applied on the principal plane up to a film thickness of 700 nm, and prebaked for 120 seconds at 90° C. Then, the resist film is exposed by a KrF-excimer laser stepper (NA: 0.55), through that mask for a KrF excimer laser which has the shade pattern 2 made of the resist (I) in which the above carbon is dispersed. Moreover, after the resist is exposed, for example, baking is performed for 90 seconds at 110° C. and development is performed for 60 seconds by 2.38 wt % aqueous tetramethylammonium hydroxide at 23° C. As a result, it is possible to form a 250-nm line-and-space pattern at 38 mJ/cm$^2$.

Moreover similarly, an i-line positive resist made of novolac resin and diazonaphthoquinone is applied onto an HMDS-treated titanium-nitride plate up to a film thickness of 1.0 μm and is baked for 90 seconds at 90° C. Then, the resist film is exposed by an i-line stepper (NA: 0.52), through an i-line mask having the shade pattern 2 made of the resist (I) in which the above carbon is dispersed. Moreover, after exposure, baking is performed 90 seconds at 110° C. and development is performed for 60 seconds by 2.38 wt % aqueous tetramethylammonium hydroxide at 23° C. As a result, it is possible to form a 350-nm line-and-space pattern at 120 mJ/cm$^2$.

Furthermore similarly, for example, an acrylic-resin-based ArF-excimer-laser positive resist is applied onto the above HMDS-treated semiconductor substrate (semiconductor wafer) up to a film thickness of 0.40 μm and is baked for 60 seconds at 130° C. Then, the resist film is exposed by an ArF-excimer-laser stepper (NA: 0.60) through an ArF excimer laser mask having the shade pattern 2 made of the resist (I) in which the carbon is dispersed. Moreover, after the resist is exposed, baking is performed for 60 seconds at 130° C. and development is performed for 60 seconds by 2.38 wt % aqueous tetramethylammonium hydroxide at 23° C. As a result, it is possible to form a 140-nm line-and-space pattern at 12 mJ/cm$^2$.

Thus, in the case of this embodiment, it is possible to increase a range of the wavelength of exposure light usable for the mask M. Therefore, it is possible to select an exposure system meeting a technical condition and an economic condition and to perform exposure treatment when various patterns of a semiconductor device are exposed. Therefore, it is possible to improve performances of a semiconductor device and to reduce the cost of the semiconductor device.

Second Embodiment

In the case of this embodiment, the shade pattern 2 is formed on the quartz plate 1 as shown in FIGS. 1, 2A, 2B, 3A, 3B and 3C similarly to the first embodiment by using the resist (II) in which carbon is dispersed and which is prepared in the preparation example 2, instead of the resist (I) in which carbon is dispersed and which is used for the first embodiment. However, the resist (II) in which carbon is dispersed is a positive resist. Therefore, an illuminated portion in a film illuminated with an electron beam is removed after development.

The resist (II) in which carbon is dispersed has an OD value of 7.0 with a film thickness of 1.0 μm at the wavelength of a KrF excimer laser beam. A film having a thickness of 0.22 μm is obtained by spin-coating of this resist (II) and baking it for 2 minutes at 110° C. Then, a mask having a 0.18 μm hole pattern is obtained by writing the mask by means of an electron-beam writing system having an acceleration voltage of 50 KV, by exposing it, and then baking it for 2 minutes at 130° C. and by developing it for 45 seconds by means of a developer same as that used for the above-mentioned first embodiment. Then, the mask is heat-treated at 150° C. while illuminating a DUV beam to the mask in order to prevent a resist pattern from being deformed.

The film thickness of the shade pattern 2 of the resist (II) in which carbon is dispersed on the heat treated mask M has a film thickness of 0.19 μm and transmittance of a KrF excimer laser beam suitable for the film thickness is 5%. Moreover, the phase of light passing through the film under this film thickness is inverted by about 180° ($\pi$). Thus, it is clarified by the present inventors that the mask M is suitable for a half-tone phase-shift mask when a KrF excimer laser beam is used as an exposure light source. Inversion of the phase of the transmitted light is not restricted to the above $\pi$, and may be $3\pi$, $5\pi$, . . . (the same is true of phase inversion).

Moreover, as a result of forming a mask M for KrF-excimer-laser exposure in which the shading portion has a different transmittance, it is clarified by the present inventors that the mask M is effective as a half-tone mask under a transmittance of 2% or more and 16% or less. Furthermore, it is clarified by the present inventors that a mask having a transmittance of about 9% or more and 16% or less has eminent effects of functioning as a half-tone mask but requires forming an auxiliary pattern because a sub-peak appears. Furthermore, it is clarified by the present inventors that in a mask having a transmittance of about 4% to 9%, a sub-peak appears but is not remarkable, and so it is possible to prevent the sub-peak by the layout of the mask. Therefore, it is clarified by the present inventors that the layout is restricted. Furthermore, it is clarified by the present inventors that a mask having a transmittance of 2% to about 4% is slightly effective as a half-tone mask but there is no sub-peak and the linearity thereof is ensured.

According to the present embodiment, the following advantages can be obtained.

(1) It is possible to exclude an etching step when a shade pattern is formed on a half-tone mask.

(2) It is possible to decrease the exposure time required for writing a shade pattern.

(3) It is possible to decrease the half-tone-mask manufacturing time because of the above items (1) and (2).

(4) It is possible to improve the yield of half-tone masks because a defect occurrence rate can be reduced in the half-tone-mask manufacturing process, due to the above item (1).

(5) It is possible to improve the dimensional accuracy of a shade pattern and the uniformity of pattern dimensions in a shade-pattern forming face because of the above item (1). Therefore, even if there is a condensation-rarefaction difference or dimensional difference or the like of a shade pattern in a shade-pattern forming face, it is possible to provide a half-tone mask having a high reliability of the pattern dimension.

Third Embodiment

In the case of the present embodiment, a negative shade pattern 2 having a film thickness of 0.60 μm and a minimum dimension of 1.0 μm is formed by using the resist (III) in which titanium dioxide is dispersed and which is prepared in the preparation example 3 instead of the resist (I), thereby forming a film on a quartz plate 1, exposing the film by an electron-beam writing system, and then baking and spray-developing the film after exposure, as shown in FIGS. 1, 2A, 2B, 3A, 3B and 3C, similarly to the case of the above-mentioned first embodiment.

An OD value of the shade pattern 2 formed by the resist (III) in which titanium dioxide is dispersed and having a film thickness of 0.60 μm is 4.8 (transmittance of 0.0016%) at an ArF-excimer-laser-beam with wavelength of 193 nm, and 3.9 (transmittance of 0.013%) at a KrF-excimer-laser-beam with a wavelength of 248 nm, and 2.4 (transmittance of 0.39%) at an i-line exposure-light with a wavelength of 365 nm.

Fourth Embodiment

In the case of the present embodiment, a positive shade pattern 2 having a film thickness of 0.70 μm and a minimum dimension of 1.2 μm is formed by using the resist (IV) in which aluminum oxide is dispersed and which is prepared in the preparation example 4, instead of the resist (I) in which carbon is dispersed and which is used for the first embodiment, thereby forming a film on a quartz plate 1, exposing the film by an electron-beam exposure system, and then baking and spray-developing the film after exposure, as shown in FIGS. 1, 2A, 2B, 3A, 3B and 3C, similarly to the first embodiment.

An OD value of a pattern formed by the resist (IV) in which aluminum oxide is dispersed and having a film thickness of 0.70 μm is 4.7 (transmittance of 0.0020%) at an ArF-excimer-laser-beam with a wavelength of 193 nm, and 3.6 (transmittance of 0.025%) at a KrF-excimer-laser-beam with a wavelength of 248 nm, and 2.2 (transmittance of 0.63%) at an i-line-exposure-light with a wavelength of 365 nm.

According to this embodiment, the following advantages can be obtained in addition to the advantages obtained from the first to third embodiments. That is, by using metal oxide as nanoparticles, it is possible to improve not only the light-resistant characteristic of the shade pattern 2 but also the mechanical strength of the shade pattern 2, namely, it is possible to improve the durability of a mask M. Therefore, it is possible to improve the life of the mask M.

Fifth Embodiment

In the case of the present embodiment, a film having a thickness of 700 nm is obtained by using the resist (V) in which carbon is dispersed and which is prepared in the preparation example 5, instead of the resist (I) in which carbon is dispersed and which is used for the first embodiment, thereby spin-coating the film on the quartz plate 1 and baking the film for 1 minute at 90° C., similarly to the case of the first embodiment as shown in FIGS. 1 to 3. The film is illuminated with the light having a wavelength of 364 nm up to 50 mJ/cm$^2$ by a laser writer (ALTA3500) from a side of the quartz plate 1, and exposed, and thereafter developed for 120 seconds by 0.2% tetramethylammonium hydroxide containing 0.05% of polyoxyethylene serving as a surface-active agent and thereby a negative shade pattern 2 is obtained. As a result, a photomask including the shade pattern 2 having a remaining film thickness of 500 nm and a minimum dimension of 2 μm is obtained. At this time, an OD value of a resist pattern portion illuminated with an i-line (365 nm) is 2.4 and the transmittance thereof is 4%. In this case, there arises no problem of charge-up thereof because the pattern is transferred by using a laser writer. Therefore, it is possible to improve the dimensional accuracy of the pattern. Moreover, because it is unnecessary to apply a conductive film for preventing charge-up thereof, it is possible to decrease the mask manufacturing process and reduce the mask cost.

Moreover, a negative mask M provided with a shade pattern 2 having a film thickness of 550 nm and a minimum dimension of 1.2 μm is formed by forming a discharge film on a resist film, exposing the film by an electron-beam writing system (HITACHI HL-800D), and then baking and spray-developing the film, similarly to the case of the first embodiment. In this case, the OD value of a resist pattern portion illuminated with an i-line (365 nm) is 2.6 and the transmittance thereof is 0.23%.

Sixth Embodiment

FIGS. 5A to 5G show a method for manufacturing a phase shift mask that is another embodiment of the present invention. A method for manufacturing a Levenson phase shift mask will be described below.

Figure 5A:
FIG. 5A is a cross-sectional view of an essential portion in the manufacturing process of a photomask that is another embodiment of the present invention.

First, as shown in FIG. 5A, a shifter film 13 is formed on the above-mentioned quartz plate (blanks) 1. The film thickness d of the shifter film 13 is set so as to be $\lambda/\{2(n-1)\}$ where it is assumed that the wavelength of exposure light is $\lambda$ and the refractive index to the exposure wavelength of the shifter film 13 is n.

In this case, though the shifter film 13 uses $SiO_x$ for sputtering formation, it is not restricted to $SiO_x$. Other film may be used as long as it passes exposure light and has uniform film thickness and refractive index. For example, it is possible to use zirconium oxide, molybdenum silicide, $CrOF_3$, or the like. Moreover, a film made of $SnO_x$, $TiO_x$, or the like having high refractive index is preferable because the film thickness d can be decreased and subsequently it is easy to form a shade pattern containing at least nanoparticles and a binder. An effect on the film thickness appears at a refractive index of 1.6 or more. Moreover, it is preferable that the shifter film 13 is a conductive film because the conductive film is not influenced by charge-up thereof at the time of EB-writing the resist shown below. As the conductive film, ITO and the like may be used.

Moreover, to improve durability thereof, the shifter film 13 is widely attached and then is heat-treated. The film thickness d is a value after the above heat treatment. In this case, for example, baking is performed for 30 minutes at 200° C. as heat treatment, but the heat treatment is not restricted to the above baking. Furthermore, because the film thickness is important to decide a phase angle, it is measured after performing the heat treatment and forming the film, and when the film thickness is not kept within a range of a reference value, the film is removed and then a new film is formed again. Though an allowable value of film thickness deviation depends on a dimension or necessary dimensional accuracy, it is generally about 1%. High resolution and dimensional accuracy are easily obtained because the shifter film 13 is widely attached on flatness thereof, and thereby the film-thickness uniformity is easily obtained, and there does not arise a problem of change in a phase angle (film thickness) per dimension due to the loading effect at the time of etching. In this case, a sputtering method is used to form the shifter film. However, it is also possible to use a CVD (Chemical Vapor Deposition) method or an application forming method. Particularly, the application forming method has such a feature that a high uniformity of film thickness is obtained. In this case, for example, it is possible to form a film with a uniformity of 0.2%. The value of 0.2% has a high accuracy corresponding to about 0.1° in terms of a phase angle deviation. Moreover, when a film defect (pinhole defect or foreign matter defect) is detected on a phase shifter film, the film is reproduced and reformed. Thus, process control is simplified because measures can be taken for a phase defect at an initial stage thereof.

Figure 5B:
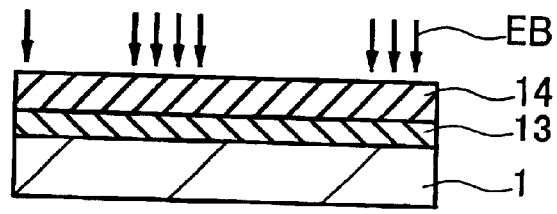
FIG. 5B is a cross-sectional view of an essential portion in the manufacturing process of a photomask that is another embodiment of the present invention.

Then, as shown in FIG. 5B, an electron-beam resist 14 is applied onto the shifter film 13 to expose a desired shifter writing pattern. When the shifter film 13 is not a conductive film, a water-soluble conductive film is formed on the electron-beam resist 14 to take measures for charge-up thereof. When the above measures are not taken, a position deviation of the written pattern is caused. In the case of this embodiment, the writing-position deviation due to charge-up thereof does not occur because a conductive film is previously formed. As a result of examining a conductivity necessary to prevent the charge-up, it is clarified that it is very effective to suppress a sheet resistivity of 50 MΩ/cm² or less.

Figure 5C:
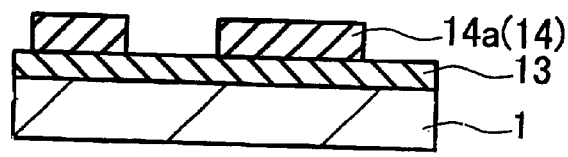
FIG. 5C is a cross-sectional view of an essential portion in the manufacturing process of a photomask that is another embodiment of the present invention.
Figure 5D:
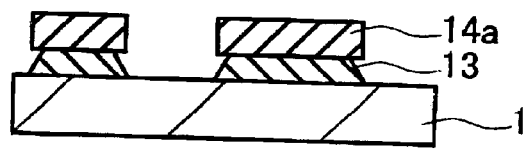
FIG. 5D is a cross-sectional view of an essential portion in the manufacturing process of a photomask that is another embodiment of the present invention.
Figure 5E:
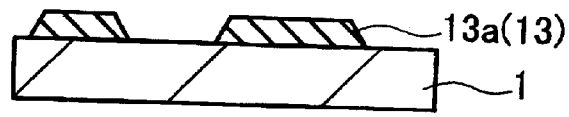
FIG. 5E is a cross-sectional view of an essential portion in the manufacturing process of a photomask that is another embodiment of the present invention.

Then, a resist pattern 14a is formed by performing development as shown in FIG. 5C and then the shifter film 13 is etched by using the resist pattern 14a as an etching mask as shown in FIG. 5D, and a shifter pattern 13a is formed on the quartz plate 1 by removing the resist pattern 14a as shown in FIG. 5E. At this time, side faces of the shifter pattern 13a are tapered. The taper angle relative to the plate 1 is set at about 60°. A cutout defect and a remaining defect of the phase shifter are inspected by the edge inspection method. Because a shade band does not surround the shifter pattern 13a, it is possible to inspect the shifter defect by an edge detection method, and thereby to perform simply a phase defect inspection with high detection accuracy.

Figure 5F:
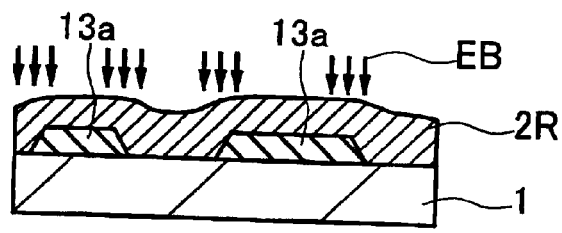
FIG. 5F is a cross-sectional view of an essential portion in the manufacturing process of a photomask that is another embodiment of the present invention.

Thereafter, as shown in FIG. 5F, the resist film 2R made of the resist (I) in which carbon is dispersed and which is prepared in the preparation example 1 is applied so as to have a film thickness of 420 nm, and desired-shaped electron-beam writing is performed. Even in the case of this exposure, it is effective to form a conductive film for preventing charge-up thereof, similarly to the case of writing the shifter pattern 13a. In the case of this embodiment, for example, a conductive film having a sheet resistivity of 30 MΩ/cm² is widely attached onto the resist film 2R made of the resist (I).

In this case, because the outer periphery of the shifter film 13 is tapered, a covering characteristic of the resist film 2R is improved and the dimensional accuracy of the shade pattern 2 is high because a film thickness deviation is comparatively small. Though there is not any pattern directly crossing a step, this tapering process is very effective because the film thickness deviation inclusive of the resist affects a wide range. In this case, a taper angle relative to the plate 1 is set to 60°. However, by setting the taper angle at a value smaller than 60° to make the taper portions gentle, it is possible to decrease the film thickness deviation. However, because it is necessary to form a shade pattern so as to cover the tapered portion by providing an adjustment play, the minimum shade-pattern width is restricted. An optimum taper angle is decided in accordance with a pattern minimum rule and a shifter and the offset of the adjustment accuracy of the shade pattern.

Figure 5G:
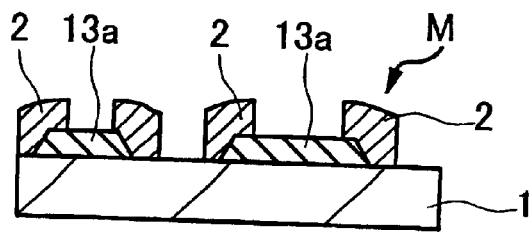
FIG. 5G is a cross-sectional view of an essential portion in the manufacturing process of a photomask that is another embodiment of the present invention.

Then, as shown in FIG. 5G, a shade pattern 2 made of the resist (I) in which carbon is dispersed is formed by performing development. Moreover, the shade pattern 2 is performed by heat treatment and/or illumination with DUV and/or both. By performing the above treatment(s), it is possible to improve the illumination-resistant characteristic relative to the exposure light of the shade pattern 2.

As a result of measuring the OD value of the formed shade pattern 2 made of the resist (I) in which carbon is dispersed and having a remaining film thickness of 400 nm, the OD value shows 3.2 at a 248 nm wavelength of a KrF excimer laser beam, and this corresponds to 0.063% in terms of transmittance. Moreover, the OD value is 4.0 at a 193 nm wavelength of an ArF excimer laser beam, and this corresponds to 0.01% in terms of transmittance. Therefore, it is clarified that the formed shade pattern 2 made of the resist (I) in which carbon is dispersed is proper as the shading portion of a Levenson phase-shift mask for KrF and ArF excimer laser beams.

Moreover, it is also possible to form a Levenson phase-shift mask by using the resists in which nanoparticles are dispersed and which are prepared in the preparation examples 3 and 4.

The phase shift mask according to this embodiment has a very high controllability whose phase error is kept within a range of 0.5° or less and has no dimensional dependency. Therefore, it is possible to improve the dimensional accuracy and resolution when a pattern is transferred. Moreover, since the shade pattern 2 contacts with the blanks and the phase shifter at a large area thereof, a defect such as pattern removal of the like does not occur either. Furthermore, the number of manufacturing steps is small in comparison with a normal mask manufacturing method using only a metallic film as a shade band, and therefore the yield thereof is also high and the TAT thereof is also short. Moreover, the TAT can be almost halved and the yield can be greatly improved from 30%, which is obtained by the above normal mask manufacturing method, to 90%.

Seventh Embodiment

A mask manufacturing method of the present embodiment is described below by referring to FIGS. 6A to 6E.

Figure 6A:
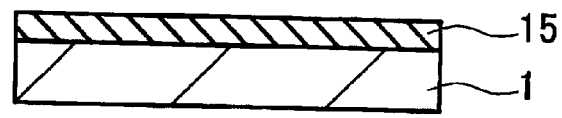
FIG. 6A is a cross-sectional view of an essential portion in the manufacturing process of a photomask that is another embodiment.

First, as shown in FIG. 6A, a photo-reactive shifter film 15 is formed on a quartz plate (blanks) 1 similar to the above described. The photo-reactive shifter film 15 uses a material, for example, obtained by adding a photoacid generator to organic SOG (Spin On Glass). The photoacid generator uses TPS (triphenyl sulfonium trifluorate), but is not restricted to this TPS. Moreover, the photo-reactive shifter film 15 too is not restricted to organic SOG, and may use such a material to be transparent for exposure light, and have illumination-resistant characteristic relative to the exposure light, and a photo-reactive characteristic at the time of mask-writing. The refractive index of the photo-reactive shifter film 15 used above relative to exposure light (with a wavelength of 193 nm) is 1.58, and the 1.58 refractive index is not greatly different from the 1.56 refractive index, which the quartz plate 1 has. Therefore, it is possible to reduce multiple interference thereof and to obtain an effect on a dimensional accuracy. Moreover, forming a conductive film on the quartz plate 1 is effective in prevention of charge-up thereof when writing of the photo-reactive shifter film 15 is subsequently performed, similarly to the sixth embodiment. In this case, formation of the photo-reactive shifter film 15 is performed by application, but may be performed by using other method such as an optical CVD method or the like. An application forming method has such a superior feature as to be simple and cause fewer defects. After the photo-reactive shifter film 15 is applied, heat treatment is performed, for example, at 120° C. After the film is formed, a defect inspection is performed and thereby it is confirmed that a pinhole defect or a foreign matter defect is or not present. If any one of these defects is present, the photo-reactive shifter film 15 is removed and a new photo-reactive shifter film is reformed.

The thickness d of the photo-reactive shifter film 15 is set to a value corrected so as to meet the equation $\lambda/\{2(n-1)\}$ after baking is performed at 250° C. to be described later. In this case, the wavelength of exposure light is assumed as λ and the refractive index of the baked photo-reactive shifter film 15 relative to an exposure wavelength is assumed as n.

Figure 6B:
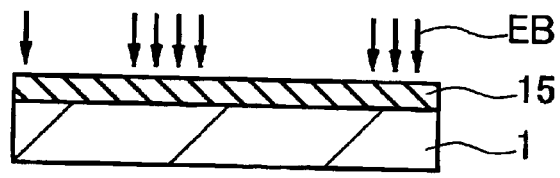
FIG. 6B is a cross-sectional view of an essential portion in the manufacturing process of a photomask that is another embodiment.

Then, as shown in FIG. 6B, the photo-reactive shifter film 15 is directly written by an electron beam. At the case of the above pattern writing, a water-soluble conductive film is formed on the photo-reactive shifter film 15 to take measures for charge-up thereof at the time of electron-beam writing. Unless the above measures are taken, the position of a written pattern is deviated due to charge-up thereof. In the case of this embodiment, a deviation of the writing position caused due to the charge-up does not occur because a conductive film is formed in advance.

Figure 6C:
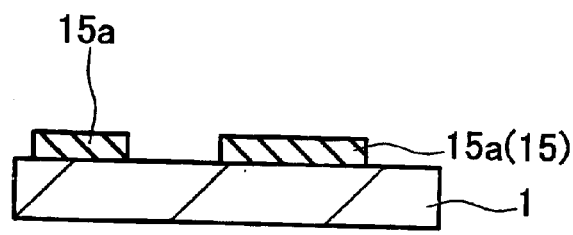
FIG. 6C is a cross-sectional view of an essential portion in the manufacturing process of a photomask that is another embodiment.

Then, as shown in FIG. 6C, a shifter pattern 15a is formed by performing development. Then, the shifter pattern 15a is heat-treated in order to improve an exposure-light illumination-resistant characteristic and prevent weathering thereof. As the above heat treatment, for example, baking is performed for 30 minutes at 250° C., but the heat treatment is not restricted to baking. The resistance is further improved as the temperature rises. Moreover, because the film thickness of the shifter pattern 15a is important to decide a phase angle, the film thickness thereof is measured after the shifter pattern 15a is heat-treated and if the film thickness is not kept within a range of a reference value, the shifter pattern 15a is removed and a new pattern is reformed. An allowable value of the film thickness deviation is influenced by a dimension and a necessary dimensional accuracy but is generally kept at about 1%. Because the shifter pattern 15a is flatly and widely attached thereto, the film-thickness uniformity is easily obtained. Since there arises no such problem that a phase angle (film thickness) per dimension changes due to the loading effect at the time of etching, high resolution and dimensional accuracy can easily be obtained. Therefore, a phase-shifter cutout defect and a remaining defect are inspected by an edge detection method. Because the shade band does not surround the shifter pattern 15a, it is possible to inspect a shifter defect by the edge detection method and thereby to perform simply a defect inspection with high detection accuracy. Thus, it is possible to form a phase shifter pattern having no defect and superior in phase controllability, only through an applying step, baking step, exposing step, and developing step without using an etching step. Thus, in the case of this embodiment, because it is unnecessary to use a resist applying step and an etching step when the shifter pattern 15a is formed, it is possible to shorten the mask manufacturing process in comparison with the sixth embodiment. Moreover, because the material cost, fuel cost, and equipment cost thereof can be reduced, it is possible to reduce the mask cost.

Figure 6D:
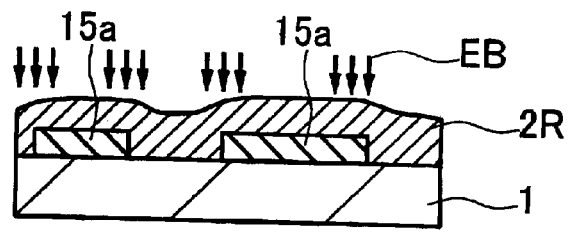
FIG. 6D is a cross-sectional view of an essential portion in the manufacturing process of a photomask that is another embodiment.

Then, as shown in FIG. 6D, a resist film 2R made of the resist (I) in which carbon is dispersed and which is prepared in the preparation example 1 is applied up to a film thickness of 420 nm to perform desired-shaped electron-beam writing. Even at the time of this exposure, it is effective to form a conductive film for preventing charge-up thereof similarly to the case of writing the shifter pattern 15a. In this embodiment, for example, a conductive film having a sheet resistivity of 40 M$\Omega$/cm² is widely attached onto the resist film 2R.

Figure 6E:
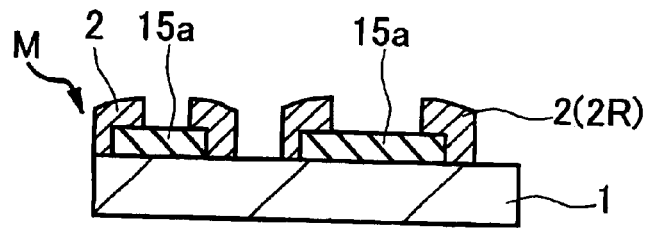
FIG. 6E is a cross-sectional view of an essential portion in the manufacturing process of a photomask that is another embodiment.

Thereafter, as shown in FIG. 6E, a shade pattern 2 made of the resist (I) in which carbon is dispersed is formed by development. Moreover, the shade pattern 2 is performed by heating and/or illumination with DUV and/or both. By performing the above treatment(s), an illumination-resistant characteristic relative to exposure light is improved.

As a result of measuring the OD value of the shade pattern 2 made of the resist (I) in which carbon is dispersed and formed so at to have a remaining film thickness of 400 nm, the same result as the case of the sixth embodiment can be obtained by using a KrF excimer laser beam or an ArF excimer laser beam. Therefore, even in the case of the seventh embodiment, it is clarified that the shade pattern 2 is proper as the shading portion of a Levenson phase-shift mask for KrF and ArF excimer-laser-beam exposures. Moreover, by using the resists in which nanoparticles are dispersed and which are prepared in the preparation examples 3 and 4, it is also possible to form a Levenson phase-shift mask.

According to this embodiment, it is possible to obtain a mask having a phase-error accuracy similar to the case of the above sixth embodiment. Since the mask has no dimensional dependency, it is possible to obtain high dimensional accuracy and resolution at the time of transferring a pattern by an ArF exposure beam. Moreover, in this case, because the shade pattern 2 contacts with the shifter pattern 15a and the quartz plate 1 at a large area thereof, a defect such as pattern removal or the like does not occur. Furthermore, the number of mask manufacturing steps is very small in comparison with the case of the above normal mask manufacturing method and the mask manufacturing steps comprise only an applying, baking, exposing, developing, and inspecting steps in which fewer defects occur (because the etching step is excluded). Therefore, the yield thereof is high and the TAT is short, too. In the case of this embodiment, it is possible to reduce the TAT up to about ⅓ and improve the yield from 30%, which is obtained by the above normal mask manufacturing method, to 90%. Though this embodiment uses, for example, ArF exposure, it is confirmed that KrF exposure is also effective, by adjusting the film thickness of the shifter pattern 15a to the KrF exposure.

Eighth Embodiment

The phase-shift-mask manufacturing method of this embodiment will be described below by referring to FIGS. 7A to 7F.

Figure 7A:
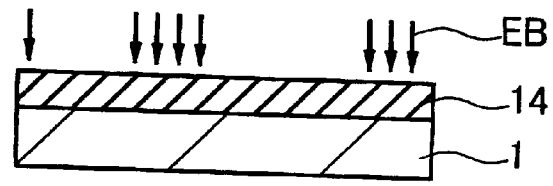
FIG. 7A is a cross-sectional view of an essential portion in the manufacturing process of a photomask that is still another embodiment of the present invention.

First, as shown in FIG. 7A, an electron-beam resist 14 is applied to and formed on a quartz plate (blanks) 1 similar to the above description to expose a desired shifter-written pattern by an electron beam EB. A water-soluble conductive film is formed on the electron-beam resist 14 to take measures for charge-up thereof at the time of electron-beam writing. Thereby, it is possible to prevent a writing-position deviation due to charge-up similarly to the case of the above first to seventh embodiments. As a result of examining a conductivity necessary to prevent the charge-up, it is clarified by the present inventors that the charge-up can be effectively prevented by suppressing a sheet resistivity up to 50 M$\Omega$/cm² or less.

Figure 7B:
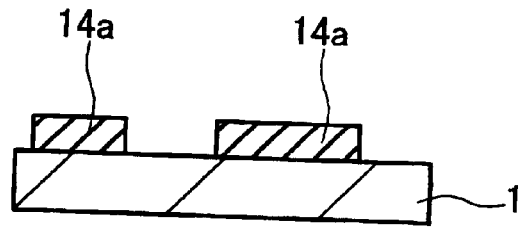
FIG. 7B is a cross-sectional view of an essential portion in the manufacturing process of a photomask that is still another embodiment of the present invention.
Figure 7C:
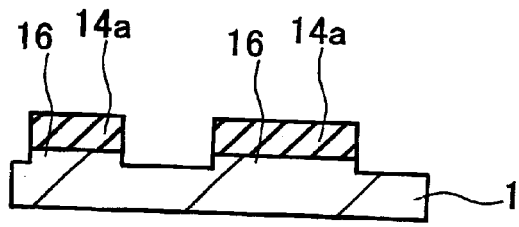
FIG. 7C is a cross-sectional view of an essential portion in the manufacturing process of a photomask that is still another embodiment of the present invention.
Figure 7D:
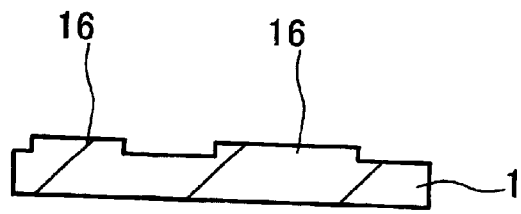
FIG. 7D is a cross-sectional view of an essential portion in the manufacturing process of a photomask that is still another embodiment of the present invention.

Then, a resist pattern 14a is formed by development as shown in FIG. 7B, then a quartz plate 1 is etched by using the resist pattern 14a as an etching mask as shown in FIG. 7C, and moreover the resist pattern 14a is removed to form a shifter pattern 16 on the quartz plate 1 as shown in FIG. 7D. At this time, a film thickness d caved by the etching is set so as to meet $\lambda/\{2(n-1)\}$ where it is assumed that the wavelength of exposure light is $\lambda$ and the refractive index relative to the exposure wavelength of the quartz plate 1 is n.

Figure 7E:
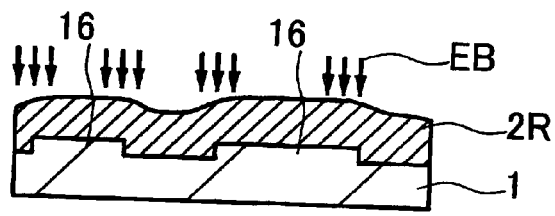
FIG. 7E is a cross-sectional view of an essential portion in the manufacturing process of a photomask that is still another embodiment of the present invention.

Then, as shown in FIG. 7E, a resist film 2R made of the resist (I) in which carbon is dispersed and which is prepared in the preparation example 1 is applied up to a film thickness of 420 nm to perform desired-shaped electron-beam writing. Even at the time of the above exposure, it is effective to form a conductive film for preventing charge-up thereof similarly to the case of writing the shifter pattern 16. In this embodiment, for example, a conductive film having a sheet resistivity of 30 M$\Omega$/cm² is widely attached onto the resist film 2R when writing of the shifter pattern 16 is performed.

Figure 7F:
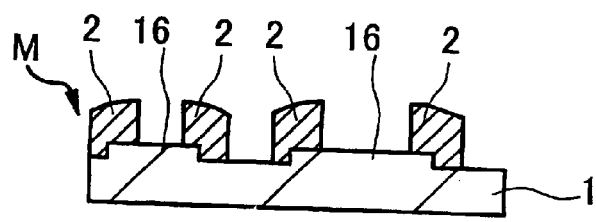
FIG. 7F is a cross-sectional view of an essential portion in the manufacturing process of a photomask that is still another embodiment of the present invention.

Then, as shown in FIG. 7F, a shade pattern 2 made of the resist (I) in which carbon is dispersed is formed by development. Moreover, the shade pattern 2 is performed by heat and/or illumination with DUV and/or both. By performing the above treatment(s), it is possible to enhance the illumination-resistant characteristic of the shade pattern 2 relative to exposure light.

As a result of measuring the OD value of the thus formed shade pattern 2 made of the resist (I) in which carbon is dispersed and formed so as to having a remaining film thickness of 400 nm, results same as the case of the above sixth and seventh embodiments are obtained even for KrF and ArF excimer laser beams. Therefore, even in the case of the eighth embodiment, it is clarified that the shade pattern 2 is proper as the shading portion of a Levenson phase-shift mask for KrF and ArF excimer laser beam exposures. In addition, even by using the resists in which nanoparticles are dispersed and which are prepared in the preparation examples 3 and 4, it is possible to form Levenson phase-shift masks similarly.

According to this embodiment, operations and effects same as those of the above sixth embodiment are obtained. That is, it is possible to enhance the pattern dimensional accuracy and resolution. Moreover, a defect such as removal of the shade pattern 2 or the like does not occur. Furthermore, it is possible to greatly improve the yield in the mask manufacturing process from 30%, which is obtained by the above normal mask, to 90%. Furthermore, it is possible to decrease the TAT for manufacturing a mask to ½ shorter than the case of manufacturing a normal mask.

Ninth Embodiment

For this embodiment, a case will be described in which the present invention is applied to a method for manufacturing a semiconductor integrated-circuit device having a twin-well CMIS (Complementary MIS) circuit by referring to FIGS. 8A to 8F.

FIGS. 8A to 8F are cross-sectional views showing essential portions of a wafer 5 in the process for manufacturing the above semiconductor integrated circuit device. A semiconductor substrate 5S constituting the wafer 5 is made, for example, of a Si single crystal whose a plan view is an n-type and is formed in a circle. An n-well NWL and a p-well PWL are, for example, formed on the upper portion of the substrate 5S. For example, phosphorus or As which is an n-type impurity is introduced into the n-well NWL. Moreover, for example, boron that is a p-type impurity is introduced into the p-well PWL. The n-well NWL and p-well PWL are formed as follows, for example.

Figure 8A:
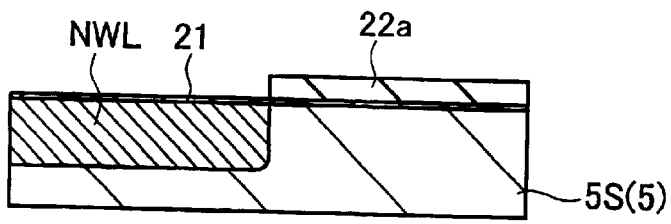
FIG. 8A is a cross-sectional view of an essential portion in the manufacturing process of a semiconductor device that is another embodiment of the present invention.

First, a wafer alignment mark for mask alignment is formed on the semiconductor substrate 5S. It is also possible to form the wafer alignment mark at the time of forming a well by adding a selective oxidation step. Then, as shown in FIG. 8A, an oxide film 21 is formed on the semiconductor substrate 5S and then a resist pattern 22a for a mask for ion implantation is formed on the oxide film 21. Then, for example, phosphorus is implanted. The resist pattern 22a for the ion-implantation mask is formed by using both an i-line reduction projection exposure system and an i-line mask M having a shade pattern 2 made of the resist in which carbon is dispersed and which is described in the above first embodiment.

In this case, because the minimum pattern width is a large value, for example, of 2 μm in this process, i-line lithography is used. As the resist pattern 22a provided on the wafer 5, for example, a non-chemical amplified positive resist is used which is made of novolac resin having a sensitivity for an i-line and diazonaphthoquinone. Moreover, by using the mask M formed in any one of the third, fourth, and fifth embodiments, it is also possible to form the resist pattern 22a for an ion-implantation mask, similarly.

Figure 8B:
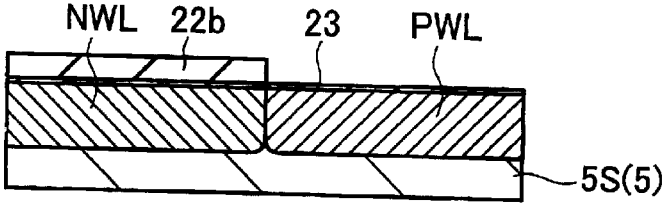
FIG. 8B is a cross-sectional view of an essential portion in the manufacturing process of a semiconductor device that is another embodiment of the present invention.

Thereafter, the resist pattern 22a is removed through ashing and the oxide film 21 is removed. Then as shown in FIG. 8B, an oxide film 23 is formed on the semiconductor substrate 5S and subsequently a resist pattern 22b for an ion-implantation mask is formed on the oxide film 23. Then, for example, boron is implanted. The resist pattern 22b for the ion-implantation mask is formed by using both an i-line reduction projection exposure system and an i-line mask M having the shade pattern 2 made of the resist in which carbon is dispersed and which is described in the first embodiment.

Also in this case, because the minimum pattern width is a large value, for example, of 2 μm in the above process, i-line lithography is used. As the resist pattern 22b provided on the wafer 5, for example, a non-chemical amplified positive resist is used which is made of novolac resin having a sensitivity for an i-line and diazonaphthoquinone. Moreover, by using the mask M formed in any one of the third, fourth, and fifth embodiments, it is also possible to form the resist pattern 22b for an ion-implantation mask, similarly.

Figure 8C:
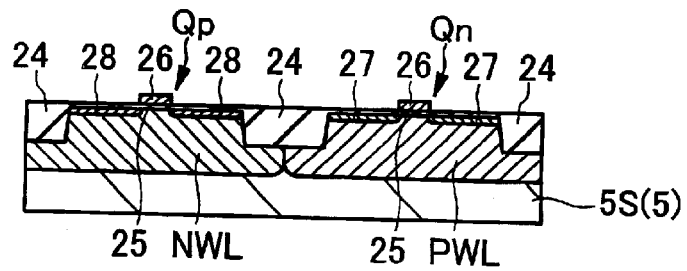
FIG. 8C is a cross-sectional view of an essential portion in the manufacturing process of a semiconductor device that is another embodiment of the present invention.

Then, the resist pattern 22b and oxide film 23 are removed. Thereafter, as shown in FIG. 8C, a field insulation film 24 for separation, which is made of, for example, a silicon oxide film is formed on the principal plane (element forming plane) of the semiconductor substrate 5S in the form of a groove-like isolation. A LOCOS (Local Oxidization of Silicon) method may be used as an isolation method. Both a KrF-excimer-laser-beam reduction projection exposure system and a mask M for a KrF excimer laser beam having the shade pattern 2 made of the resist in which carbon is dispersed and which is described in the first embodiment are used for the lithography at the time of forming the isolation.

An nMIS Qn and a pMIS Qp are formed in an active area surrounded by the field insulation film 24. Gate-insulating films 25 of the nMIS Qn and pMIS Qp are each composed, for example, of a silicon oxide film through the thermal oxidization method. Moreover, gate electrodes 26 of the nMIS Qn and pMIS Qp are each formed by depositing a gate-forming film made of, for example, low-electrical-resistance polysilicon through a CVD method or the like, thereafter lithographing the film by both an ArF-excimer-laser-beam reduction projection exposure system and a mask M for an ArF excimer laser beam having the shade pattern 2 composed of the resist in which carbon is dispersed and which is described in the first embodiment, and the etching the film. At this time, as the resist provided on the wafer 5, for example, an acrylic-resin-based chemical amplified resist is used. It is also possible to form each agate electrode 26 through lithography performed by using both a KrF-excimer-laser-beam reduction projection exposure system and a Levenson phase-shift mask for a KrF excimer laser beam having the shade pattern 2 composed of the resist in which carbon is dispersed and which is described in any one of the sixth to eighth embodiments. However, it is more preferable to use ArF-excimer-laser-beam exposure from the viewpoint of dimensional accuracy. It is still more preferable to use the phase shift mask described in the sixth, seventh or eighth embodiment because dimensional accuracy thereof is improved.

Each semiconductor region 27 of the nMIS Qn is formed in self-alignment relative to each gate electrode 26 by introducing, for example, phosphorus or arsenic or the like into the semiconductor substrate 5S through ion implantation using each gate electrode 26 as a mask. Moreover, the semiconductor region 28 of the pMIS Qp is formed in self-alignment relative to each gate electrode 26 by introducing, for example, boron into the semiconductor substrate 5S through an ion implantation method or the like using the gate electrode 26 as a mask. However, the gate electrode 26 is not restricted to an electrode formed by a low-electrical-resistance polysilicon single film and various modifications of the electrode 26 can be made. For example, the electrode 26 may be formed as a so-called polycide structure in which a silicide layer made of tungsten silicide or cobalt silicide or the like is provided on a low-electrical-resistance polysilicon film, or as a so-called polymetal structure in which a metallic film made of tungsten or the like is provided on a low-electrical-resistance polysilicon film through a barrier conductive film made of titanium nitride or tungsten nitride or the like.

Figure 8D:
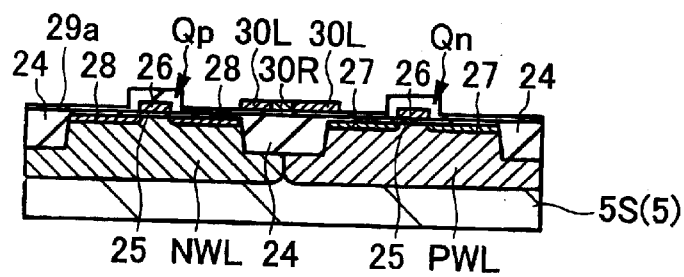
FIG. 8D is a cross-sectional view of an essential portion in the manufacturing process of a semiconductor device that is another embodiment of the present invention.

First, an interlayer dielectric film 29a formed, for example, of a silicon oxide film is deposited on the semiconductor substrate 5S by a CVD method or the like as shown in FIG. 8D, and then a polysilicon film is deposited on the film 29a by a CVD method or the like. Then, each wiring 30L and each resistance 30R formed of a polysilicon film are formed by lithographing the polysilicon film by means of both a KrF-excimer-laser-beam reduction projection exposure system and a mask M for a KrF excimer laser beam having the shade pattern 2 made of the resist in which carbon is dispersed and which is used in the first embodiment, by etching and patterning the film, and then by introducing an impurity into a predetermined area of the patterned polysilicon film. A chemical amplified resist, for example, using, as a base resin, phenol resin having a sensitivity for a KrF excimer laser beam is used for the resist on the wafer 5 used to pattern the film. Because the requested pattern dimension and pattern accuracy are milder than those of a gate, the cost is reduced by using KrF excimer laser beam exposure having an exposure cost lower than that of ArF excimer laser beam exposure. Which of ArF excimer laser beam exposure or KrF excimer laser beam exposure is used is determined in accordance with the counterbalance between a necessary minimum dimension, a requested dimensional accuracy, and a cost required for the process.

Figure 8E:
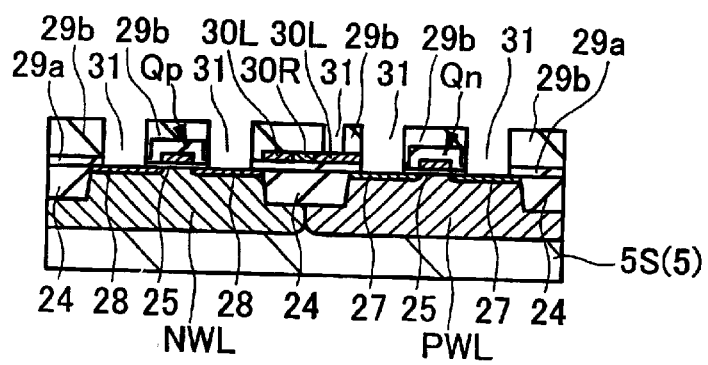
FIG. 8E is a cross-sectional view of an essential portion in the manufacturing process of a semiconductor device that is another embodiment of the present invention.

Thereafter, as shown in FIG. 8E, an interlayer dielectric film 29b made, for example, of a silicon oxide film is deposited on the semiconductor substrate 5S by a CVD method or the like, and then contact holes 31 from which the semiconductor regions 27 and 28 and portions of the wiring 30L are exposed are perforated through the interlayer dielectric films 29a and 29b by using both a KrF-excimer-laser-beam reduction projection exposure system and a half-tone phase-shift mask for a KrF excimer laser beam having the shade pattern 2 made of the resist in which carbon is dispersed and which is used in the second embodiment, and thereby by performing lithography and etching. At the time of the above patterning, a chemical amplified resist using, as a base resin, a phenol resin having a sensitivity for a KrF excimer laser beam is used as the resist on the wafer 5.

Because each diameter of the contact holes 31 is, for example, 0.18 µm, KrF excimer laser beam exposure is used. However, for example, in the case where a diameter smaller than 0.15 µm is required, it is preferable to use an ArF excimer laser exposure. This is because it is difficult to stably resolve smaller holes than 0.15 µm in diameter by KrF excimer laser beam exposure.

Figure 8F:
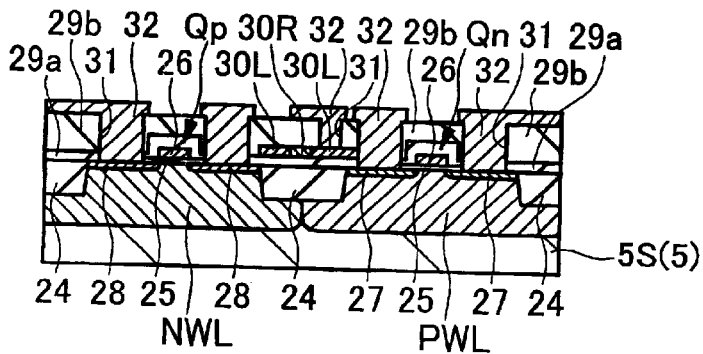
FIG. 8F is a cross-sectional view of an essential portion in the manufacturing process of a semiconductor device that is another embodiment of the present invention.
Figure 9:
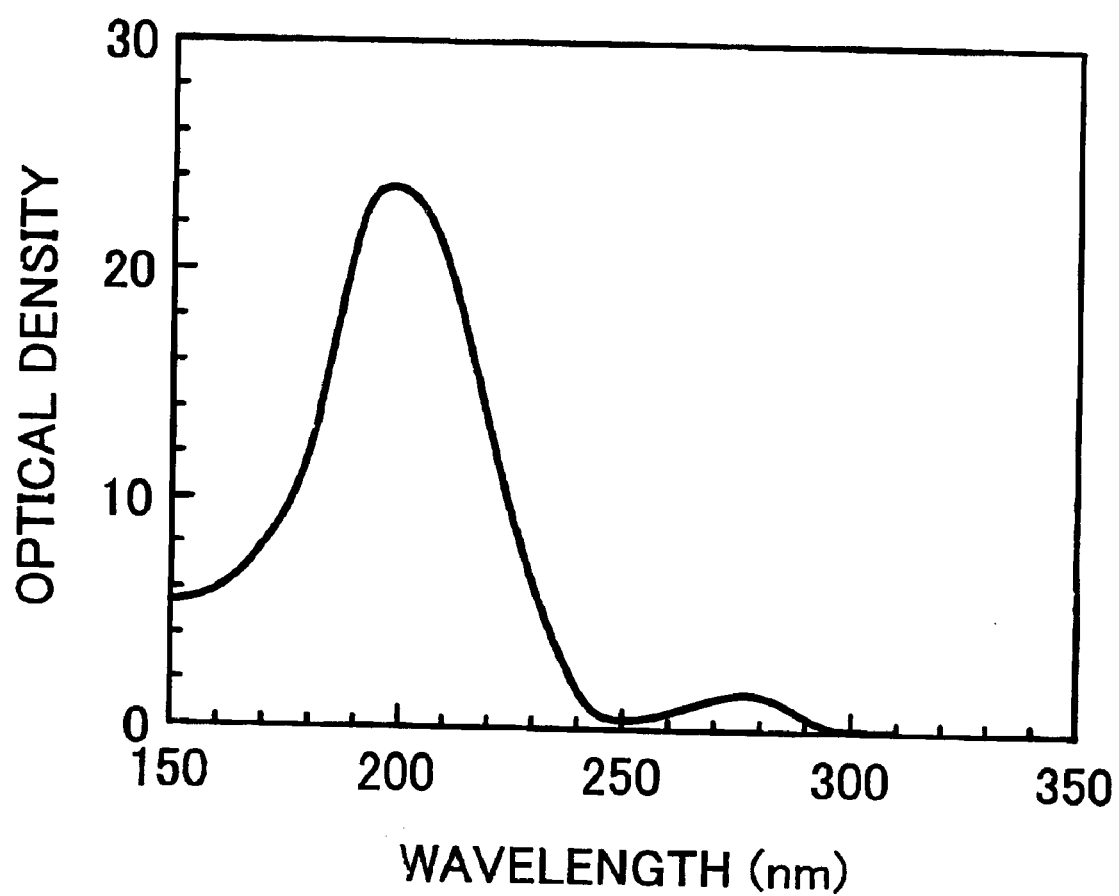
FIG. 9 is a characteristic diagram showing a spectral characteristic of a typical electron-beam resist using phenol resin as a base studied by the present inventors.

Moreover, as shown in FIG. 8F, a first-wiring layer 32 is formed by successively depositing, on the semiconductor substrate 5S, metallic films made of titanium (Ti), titanium nitride (TiN), and tungsten (W) by means of a sputtering method or a CVD method or the like, then by lithographing the films by means of using both a KrF-excimer-laser-beam reduction projection exposure system and the mask M for a KrF excimer laser beam having the shade pattern 2 made of the resist in which carbon is dispersed and which is used for the first embodiment, and by performing etching. A chemical amplified resist using, as a base resin, phenol resin having a sensitivity for a KrF excimer laser beam is used on the wafer 5 at the time of pattering the wiring 22. Wiring layers from a second wiring layer downward are formed similarly to the first wiring layer 32 to manufacture a semiconductor integrated circuit device. In this case, because a wiring pitch therebetween is, for example, 0.36 µm, KrF excimer laser beam exposure is used. However, because of a relation between a resolution and a wiring pitch, ArF excimer laser beam exposure is used in the case of forming a wiring-pitch pattern at, for example, 0.3 µm.

In the case of custom-made LSI products, a mask debug is frequently executed mainly on the first wiring layer 32. The speed of the TAT for supplying a mask to the first wiring layer 32 decides the product development force, and thereby the necessary number of masks required increases, too. Therefore, it is eminently effective to apply the present invention to this process. Moreover, the minimum pattern dimension of the second wiring layer is, for example, 0.35 µm (a pattern pitch is, for example, 0.8 µm) whose value is large enough in comparison with an exposure wavelength (0.248 µm). Therefore, the KrF-excimer-laser-beam mask M having the shade pattern 2 made of the resist in which carbon is dispersed and which is used in the first embodiment of the present invention is applied to the second wiring layer.

By using the mask M having the shade pattern 2 containing nanoparticles represented by carbon of the present invention, it is possible to correspond to i-line, KrF, and ArF. Therefore, because a proper light source and a proper exposure system may be used in accordance with a dimension thereof, this is useful for reduction in cost. Moreover, it is possible to achieve the lower cost than the above normal mask, and to shorten the TAT. Furthermore, the mask M having the shade pattern 2 containing nanoparticles represented by carbon is stable relative to exposure light, and both the transmittance and the shape of the shade pattern 2 provided on the mask M are not changed even after a KrF excimer laser beam of 700 J/cm$^2$ is illuminated which is the quantity of exposure light corresponding to production of 3,000,000 custom-made LSIs.

As described above, the present invention having been made by the present inventors is specifically explained in accordance with the embodiments. However, the present invention is not restricted to the above-mentioned embodiments. It is needless to say that various modifications of the present invention can be made without departing from the gist thereof.

For example, a shade pattern may be removed from a mask by means of peeling. That is, the shade pattern may be removed therefrom, with the shade pattern being attached to an adhesive tape.

Moreover, the ninth embodiment has explained the case where the present invention is applied to a method for manufacturing a semiconductor device having a CMIS circuit. However, the present invention is not restricted to the above case and various modifications thereof can be made. For example, it is possible to apply the present invention to a semiconductor device having a memory circuit such as a DRAM (Dynamic Random Access Memory), an SRAM (Static Random Access Memory), a flash memory (EEPROM: Electrically Erasable Programmable Read Only Memory) or the like, or a semiconductor device having a logic circuit such as a microprocessor or the like, or a mixed-type semiconductor device having both the above memory and logic circuit on the same semiconductor substrate.

The above explanation is mainly that the present invention is applied to a semiconductor device manufacturing method which is an applicable field serving as the background thereof. However, the present invention is not restricted to this, and can be also applied, for example, to a method for manufacturing a liquid-crystal panel, a disk array, a magnetic disk head, or a micro-machine.

Among aspects of the invention disclosed by this application, advantages obtained from typical aspects of the present invention will be briefly described below.

(1) According to the present invention, by using a photomask having a shade pattern containing at least nanoparticles and a binder, it is possible to obtain a sufficient shading characteristic in such an area that exposure light has a wavelength from 100 nm to several hundreds nm.

(2) According to the present invention, by using a photomask having a shade pattern containing at least nanoparticles and a binder, it is possible to obtain a photomask having such a high light-resistant characteristic that the shading characteristic of the mask is not changed even after the mask is used for a long time.

(3) According to the present invention, by using a photomask having a shade pattern containing at least nanoparticles and a binder, it is possible to exclude an etching step at the time of forming a mask pattern of the photomask, and therefore decrease the photomask manufacturing time.

(4) According to the above item (3), by developing or manufacturing a semiconductor device through the exposure treatment using the above photomask, it is possible to decrease the developing period or the manufacturing time of the semiconductor device.

(5) According to the present invention, by using a photomask having a shade pattern containing at least nanoparticles and a binder, it is possible to exclude an etching step at the time of forming a mask pattern of the photomask, and thereby reduce the cost of the photomask.

(6) According to the above item (5), by manufacturing a semiconductor device through the exposure treatment using the photomask, it is possible to reduce the cost of the semiconductor device.

(7) According to the present invention, by using the above photomask, it is possible to develop a small quantity of various kinds of semiconductor devices for a short time and manufacture the semiconductor devices at a low cost.

The present invention further includes the following embodiments.

1. A manufacturing method of a photomask, comprising the steps of:
    forming, on a glass plate, a film including at least nanoparticles and a binder;
    exposing said film; and
    developing said film to form a shade pattern.

2. A manufacturing method of a photomask having such a structure of a phase shifter for partially inverting the phase of exposure light, and having a shade for preventing transmission of said exposure light, on a transparent mask basic substance,
    the semiconductor method comprising the steps of:
        forming photo-reactive glass on said mask basic substance;
        forming a phase shifter by exposing and developing said photo-reactive glass;
        forming, on said phase shifter, a film including at least nanoparticles and a binder; and
        forming a shade pattern by exposing and developing the film including at least said nanoparticles and said binder.

3. A manufacturing method of a photomask having a structure of a phase shifter for partially inverting the phase of exposure light and having a shade for preventing transmission of said exposure light, on a transparent mask basic substance,
    the manufacturing method comprising the steps of:
        forming an coated-glass film on said mask basic substance;
        applying a resist onto said coated-glass film;
        exposing and developing said resist to form a resist pattern;
        etching said coated-glass film by using said resist pattern as a mask;
        removing said resist pattern to form a phase-shifter pattern;
        forming, on said phase-shifter pattern, a film including at least nanoparticles and a binder;
        exposing and developing a film including at least said nanoparticles and said binder to form a shade pattern.

4. A manufacturing method of a photomask having a structure of a phase shifter for partially inverting the phase of exposure light and having a shade for preventing transmission of said exposure light, on a transparent mask basic substance,
    the manufacturing method comprising the steps of:
        applying a resist onto said mask basic substance;
        exposing and developing a desired shifter pattern on said resist to form a resist pattern;
        treating the mask basic substance by using said resist pattern as a mask;
        removing said resist pattern to form a phase-shifter pattern;
        forming, on said phase-shifter pattern, a film including at least nanoparticles and a binder; and
        exposing and developing the film including at least said nanoparticles and said binder to form a shade pattern.

5. The photomask manufacturing method above any one of items 2 to 4,
    wherein an alignment mark for performing exposure and alignment is in advance formed on said mask basic substance by a metallic film, and
    wherein the position of said alignment mark is referred to perform both exposure for forming a shifter pattern and exposure for forming a shade pattern formed by a film including at least nanoparticles and a binder.

6. The photomask manufacturing method above any one of items 1 to 5,
    wherein said nanoparticles are inorganic matter.

7. The photomask manufacturing method above any one of items 1 to 6,
    wherein said nanoparticles are carbon.

8. The photomask manufacturing method above any one of items 1 to 7,
    wherein the transmittance of said shade pattern is 16% or less when an exposure wavelength is 100 nm or more and 500 nm or less.

9. The photomask manufacturing method above any one of items 1 to 7,
    wherein the transmittance of said shade pattern is 16% or less when an exposure wavelength is 100 nm or more and 700 nm or less.

10. The photomask manufacturing method above any one of items 1 to 7,
   wherein the transmittance of said shade pattern is 1% or less when an exposure wavelength is 100 nm or more and 500 nm or less.
11. The photomask manufacturing method above any one of items 1 to 7,
   wherein the transmittance of said shade pattern is 1% or less when an exposure wavelength is 100 nm or more and 700 nm or less.
12. The photomask manufacturing method above any one of items 1 to 11,
   wherein the step of exposing the film including at least said nanoparticles and said binder is a step of performing writing of an electron beam.
13. The photomask manufacturing method above any one of claims 1 to 12,
   further comprising a step of performing an anti-charge-up treatment to perform the exposure for forming a shade pattern formed by a film including at least a shifter pattern, nanoparticles, and a binder.
14. The photomask manufacturing method above any one of items 1 to 13,
   further comprising a step of forming the shade pattern containing at least said nanoparticles and said binder and thereafter supplying energy to said shade pattern.
15. A patterning method comprising the steps of:
   forming, on a substrate to be treated, a film made of a photo-reactive composition;
   exposing the film made of said photo-reactive composition through the photomask which is described in any one of claims 1 to 14 and in which a predetermined pattern is formed; and
   forming a pattern of a photo-reactive composition on said substrate to be treated, by developing the film made of said photo-reactive composition.
16. The patterning method above item 15,
   wherein the exposure light has a wavelength of 100 nm or more and 700 nm less.
17. The patterning method above item 15 or 16,
   wherein a water alkali developer is used for said development.
18. A semiconductor device manufacturing method comprising the steps of:
   forming a resist pattern on a semiconductor substrate by the patterning method described in items 15, 16 or 17; and
   performing one of etching said semiconductor substrate and implanting ions in accordance with said resist pattern.
19. A photomask manufacturing method comprising the steps of:
   forming, on a mask basic substance, a film including at least nanoparticles and a binder;
   exposing said film;
   developing said film to form a shade pattern; and
   supplying energy to said mask basic substance to reduce an amount of a binder, and thereby forming such a configuration that the amount of said nanoparticles becomes relatively more than that of said binder in said shade pattern.

20. A photomask manufacturing method comprising the steps of:
   forming, on a mask basic substance, a film including at least nanoparticles and a binder;
   exposing said film;
   developing said film to form a shade pattern; and
   supplying energy to said mask basic substance to removing the binder, and thereby constituting said shade pattern by said nanoparticles.

What is claimed is:
1. A photomask having, on a glass plate, a shade pattern containing at least nanoparticles, a light-absorption component, and a binder, wherein said nanoparticles in said shade pattern have an exposure-light-scattering characteristic which substantially restricts transmittance of exposure light through the nanoparticles.
2. The photomask according to claim 1,
   wherein said glass plate has a structure of a phase shifter for partially inverting the phase of exposure light and has, on said phase shifter, the shade pattern containing at least said nanoparticles, said light-absorption component, and the binder.
3. The photomask according to claim 2,
   wherein said phase shifter is applying-forming glass.
4. The photomask according to claim 2,
   wherein said phase shifter has such a structure that said glass plate is dented.
5. The photomask according to claim 1,
   wherein said shade pattern includes a plurality of nanoparticles having different diameters.
6. The photomask according to claim 1,
   wherein the refractive index of said nanoparticles to exposure light is different from that of said binder.
7. The photomask according to claim 1,
   wherein said nanoparticles are inorganic matter.
8. The photomask according to claim 1,
   wherein said nanoparticles are carbon.
9. The photomask according to claim 1,
   wherein the transmittance of said shade pattern is 16% or less when an exposure wavelength is 100 nm or more and 500 nm or less.
10. The photomask according to claim 1,
   wherein the transmittance of said shade pattern is 16% or less when an exposure wavelength is 100 nm or more and 700 nm or less.
11. The photomask according to claim 1,
   wherein the transmittance of said shade pattern is 1% or less when an exposure wavelength is 100 nm or more and 500 nm or less.
12. The photomask according to claim 1,
   wherein the transmittance of said shade pattern is 1% or less when an exposure wavelength is 100 nm or more and 700 nm or less.
13. The photomask according to claim 1,
   wherein each diameter of said nanoparticles is 200 nm or less.
14. The photomask according to claim 1,
   wherein the content of said nanoparticles in said shade pattern is 10 % or more and 99% or less.

* * * * *